United States Patent
Mao et al.

(10) Patent No.: US 12,021,407 B2
(45) Date of Patent: Jun. 25, 2024

(54) WIRELESS CHARGING RECEIVING APPARATUS, METHOD, TERMINAL, AND SYSTEM

(71) Applicant: Huawei Technologies Co., Ltd., Shenzhen (CN)

(72) Inventors: Yunhe Mao, Shenzhen (CN); Zhixian Wu, Dongguan (CN); Xiaosheng Zeng, Shenzhen (CN); Yanding Liu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 543 days.

(21) Appl. No.: 17/244,017

(22) Filed: Apr. 29, 2021

(65) Prior Publication Data
US 2021/0249889 A1    Aug. 12, 2021

Related U.S. Application Data

(63) Continuation of application No. PCT/CN2018/113072, filed on Oct. 31, 2018.

(51) Int. Cl.
*H02J 7/02* (2016.01)
*B60L 53/12* (2019.01)
(Continued)

(52) U.S. Cl.
CPC .............. *H02J 7/02* (2013.01); *B60L 53/12* (2019.02); *H02J 50/12* (2016.02); *H02J 50/80* (2016.02); *H03L 7/085* (2013.01); *H03L 7/099* (2013.01)

(58) Field of Classification Search
None
See application file for complete search history.

(56) References Cited

U.S. PATENT DOCUMENTS 6,208,216 B1 *  3/2001  Nasila .................... H03C 3/095
                                                  332/110
9,787,141 B2    10/2017  Karalis et al.
(Continued)

FOREIGN PATENT DOCUMENTS

CN    103457362 A    12/2013
CN    104617946 A     5/2015
(Continued)

OTHER PUBLICATIONS

P. Wisartpong et al., "Pulse Width Modulation Based on Phase Locked Loop," Proc. of ECTI-CON 2008, IEEE, pp. 697-700. (Year: 2008).*
(Continued)

*Primary Examiner* — Leigh M Garbowski
(74) *Attorney, Agent, or Firm* — SLATER MATSIL, LLP

(57) ABSTRACT

A wireless charging receiving apparatus is provided, which includes a receiver coil, a rectifier, and a controller. The receiver coil is configured to receive electromagnetic energy and output an alternating current. The rectifier includes at least two controllable switches, and is configured to rectify the alternating current from the receiver coil to a direct current s. The controller is configured to perform phase-locking on a phase of a current fundamental component of the alternating current received by the rectifier, to obtain a periodic signal having a same frequency as the current fundamental component; and the controller is further configured to: generate a synchronization reference signal having the same frequency as the periodic signal, generate drive signals of the controllable switches in the rectifier based on the synchronization reference signal, and control, based on the drive signals, controllable switches in the rectifier to convert the alternating current into the direct current.

20 Claims, 23 Drawing Sheets

(51) Int. Cl.
*H02J 50/12* (2016.01)
*H02J 50/80* (2016.01)
*H03L 7/085* (2006.01)
*H03L 7/099* (2006.01)

(56) References Cited

U.S. PATENT DOCUMENTS

| | | |
|---|---|---|
| 10,714,976 B2 | 7/2020 | Uchimoto |
| 2013/0033118 A1 | 2/2013 | Karalis et al. |
| 2016/0352152 A1 | 12/2016 | Karalis et al. |
| 2016/0368387 A1 | 12/2016 | Pavlovsky et al. |
| 2017/0149282 A1 | 5/2017 | Menegoli et al. |
| 2017/0149294 A1 | 5/2017 | Wight et al. |

FOREIGN PATENT DOCUMENTS

| | | |
|---|---|---|
| CN | 204559246 U | 8/2015 |
| CN | 106891763 A | 6/2017 |
| CN | 107248788 A | 10/2017 |
| JP | H09201059 A | 7/1997 |
| JP | 2013090358 A | 5/2013 |
| JP | 2015096007 A | 5/2015 |
| JP | 2017212858 A | 11/2017 |
| KR | 20120088266 A | 8/2012 |
| WO | 2017136491 A1 | 8/2017 |

OTHER PUBLICATIONS

Mai, R. et al., "An Active-Rectifier-Based Maximum Efficiency Tracking Method Using an Additional Measurement Coil for Wireless Power Transfer," IEEE Transactions on Power Electronics, vol. 33, No. 1, Jan. 2018, 13 pages.

Thrimawithana, D.J. et al., "A Synchronization Technique for Bidirectional IPT Systems," IEEE Transactions on Industrial Electronics, vol. 60, No. 1, Jan. 2013, 9 pages.

Cochran, S. et al., "Frequency Synchronization and Control for a 6.78 MHz WPT Active Rectifier," 2018 IEEE 19th Workshop on Control and Modeling for Power Electronics (COMPEL), Jun. 25-28, 2018, 7 pages.

Jiang, L. et al., "A GaN-based 100 W Two-Stage Wireless Power Transmitter with Inherent Current Source Output," 2016 IEEE Pels Workshop on Emerging Technologies: Wireless Power Transfer (WoW), 2016, 8 pages.

* cited by examiner

S901

Generate drive signals of controllable switching transistors of the rectifier based on the synchronization reference signal and a second preset comparison value

WIRELESS CHARGING RECEIVING APPARATUS, METHOD, TERMINAL, AND SYSTEM

CROSS-REFERENCE TO RELATED APPLICATIONS

This application is a continuation of International Application No. PCT/CN2018/113072, filed on Oct. 31, 2018, the disclosure of which is hereby incorporated by reference in its entirety.

TECHNICAL FIELD

This application relates to the field of power electronic technologies, and in particular, to a wireless charging receiving apparatus, a method, a terminal, and a system.

BACKGROUND

With aggravation of an energy shortage and environmental pollution in the modern society, as new energy vehicles, electric vehicles have received widespread attention once launched. However, most existing electric vehicles can run for a relatively short distance due to a limitation of a battery capacity. In addition, a long battery charging time of the electric vehicles and a shortage of corresponding charging station resources become a biggest bottleneck that impedes application and popularization of the electric vehicles.

Battery charging methods for the electric vehicles usually include contact charging and wireless charging. The contact charging means that metal of a plug contacts with metal of a socket to conduct electricity, and the wireless charging means that a coupled electromagnetic field is used as a medium to transfer electric energy. Compared with the contact charging, the wireless charging has many advantages, and becomes a mainstream charging manner of future electric vehicles. When working, a wireless charging system needs to adjust its output power, in other words, performs tuning. The output power of the wireless charging system is determined by output power of a rectifier, and equivalent impedance of the rectifier determines a value of the output power of the rectifier. Therefore, the output power of the wireless charging system is usually adjusted by adjusting the equivalent impedance of the rectifier. The equivalent impedance of the rectifier is obtained by dividing a bridge arm voltage of the rectifier by an input current of the rectifier. Consequently, the bridge arm voltage and the input current of the rectifier may be controlled to adjust the equivalent impedance of the rectifier.

The wireless charging system undergoes a process of development from un-tuning through passive tuning to active tuning. To perform the un-tuning, a direct current conversion circuit is used to adjust output power. To perform the passive tuning, passive components such as an inductor and a capacitor are used to adjust output power. To perform the active tuning, a switch is used. Descriptions are separately provided below with reference to accompanying drawings.

FIG. 1 is a schematic diagram of an un-tuned wireless charging system in which a direct current conversion circuit is at a transmit end. FIG. 2 is a schematic diagram of an un-tuned wireless charging system in which a direct current conversion circuit is in a receiving apparatus.

It can be learned that, a direct current conversion circuit 201 is disposed at the transmit end of the wireless charging system in FIG. 1 while the direct current conversion circuit 201 is disposed in the receiving apparatus of the wireless charging system in FIG. 2.

It can be learned from FIG. 1 and FIG. 2 that, one stage of direct current conversion circuit 201 needs to be added to the un-tuned wireless charging system. In addition, a direct current conversion circuit may be added to each of the transmit end and the receiving apparatus. This shows that a quantity of stages of conversion circuits is increased.

Therefore, a passive tuning method is proposed to reduce the quantity of stages of conversion circuits. In this method, impedance of the transmit end and the receiving apparatus is adjusted by using the passive devices such as the inductor and the capacitor, and a resonance frequency may be changed by adjusting the impedance, so as to adjust a resonance state of the wireless charging system. However, due to impact of tolerance and adjustment precision of the passive devices, the passive tuning requires a large quantity of passive devices with a relatively large size and low precision.

To resolve a technical problem that there are many machines and precision is low in the passive tuning, the active tuning is proposed. To be specific, the bridge arm voltage and the input current of the rectifier are adjusted by controlling switch-on and switch-off of the switch. However, when load jumps, the wireless charging system works unstably in the active tuning.

SUMMARY

This application provides a wireless charging receiving apparatus, a method, a terminal, and a system, and a bridge arm voltage and an input current of a rectifier can be controlled when load jumps, thereby ensuring that the wireless charging system works stably.

In the wireless charging receiving apparatus provided by the embodiments of the present application, a controller is used to perform phase-locking on a phase of a current fundamental component of an alternating current obtained at an input end of a rectifier, and the controller may obtain a periodic signal having a same frequency as the current fundamental component by using the phase-locking. The periodic signal and the current fundamental component have the same frequency by using phase-locked closed loop control. Because the phase-locking has inertia, when a frequency of the current fundamental component changes due to a sudden change of load, a frequency of the periodic signal does not suddenly change. The controller generates a synchronization reference signal having the same frequency as the periodic signal, and generates drive signals of controllable switches in the rectifier based on the synchronization reference signal. Because the drive signals determine a frequency of the bridge arm voltage of the rectifier, when the drive signals and the current fundamental component have the same frequency, the bridge arm voltage and the current fundamental component also have the same frequency. It is ensured that the bridge arm voltage is synchronized with the current fundamental component, and therefore, it can be ensured that a wireless charging system works in a steady state, and the system does not work unstably due to the sudden change of the load.

The rectifier may be a full-bridge rectifier or a half-bridge rectifier. For the full-bridge rectifier, the bridge arm voltage is a voltage between two bridge arm midpoints. For the half-bridge rectifier, the bridge arm voltage is a voltage between a bridge arm midpoint and the ground.

In a possible implementation, the controller performs phase-locking on a phase signal of the current fundamental component to obtain the periodic signal. The phase-locking comprises the first round of phase-locking and a non-first round of phase-locking. The first round of phase-locking is phase-locking in the first period. In the first round of phase-locking, the controller obtains a phase difference between a current fundamental component and an initial preset periodic signal, performs low-pass filtering on the phase difference to obtain a filtered phase difference, performs proportional-integral control on the filtered phase difference to obtain a first period value, where the first period value is inversely proportional to the phase difference, obtain, based on the first period value, a periodic signal corresponding to the first round of phase-locking. Because a periodic signal is not generated in the first period, the initial preset periodic signal is compared with the current fundamental component.

In the non-first round of phase-locking, the controller compares a periodic signal of a previous period that is obtained after phase-locking with a current fundamental component of a present period, to obtain a periodic signal of the present period. A difference between the non-first round of phase-locking and the first round of phase-locking is that there has been the periodic signal of the previous period, and therefore, the periodic signal of the previous period is compared with the current fundamental component.

That the controller may control the first period value to be inversely proportional to the phase difference in a proportional-integral stage is specifically if the phase of the current fundamental component leads a phase of the periodic signal, the phase difference is positive. Therefore, the first period value should be decreased, and the frequency of the periodic signal should be increased, so that the periodic signal and the current fundamental component have a same phase. If the phase of the current fundamental component lags behind a phase of the periodic signal, the phase difference is negative. Therefore, the first period value should be increased, and the frequency of the periodic signal should be decreased, so that the periodic signal and the current fundamental component have a same phase.

In a possible implementation, that the controller generates a synchronization reference signal having the same frequency as the periodic signal is specifically obtaining the synchronization reference signal based on the first period value in a phase-locking stage and a first preset comparison value, where the first preset comparison value may be set based on a phase difference between the periodic signal and the synchronization reference signal. A process in which the controller generates the synchronization reference signal is that, the controller counts from 0 to the first period value in each period to form a counting sequence, obtains a triangle wave based on the counting sequence, and compares an instantaneous value of the triangle wave with the first preset comparison value, where a part that is of the triangle wave whose instantaneous value is greater than the first preset comparison value forms a high level of the synchronization reference signal, and a part that is of the triangle wave whose instantaneous value is less than the first preset comparison value forms a low level of the synchronization reference signal. That is, chopping is performed on the triangle wave by using an instantaneous value corresponding to the first preset comparison value to obtain the synchronization reference signal. In this embodiment, the synchronization reference signal is generated by using the first period value and the first preset comparison value, because the first period value determines the frequency of the synchronization reference signal, and the first preset comparison value determines the phase difference between the periodic signal and the synchronization reference signal. The first preset comparison value may be set according to a requirement.

In a possible implementation, that the controller is further configured to generate drive signals of controllable switches in the rectifier based on the synchronization reference signal is specifically generating the drive signals of the controllable switches in the rectifier based on the synchronization reference signal and a second preset comparison value, where the second preset comparison value is half of the first period value.

In a possible implementation, the rectifier may be a full-bridge rectifier, and the full-bridge rectifier includes two bridge arms. The controller generates a first drive signal of a front bridge arm and a second drive signal of a rear bridge arm based on the synchronization reference signal, a phase-shift angle between the two bridge arms, and a second preset comparison value. The phase-shift angle is a phase difference between the first drive signal and the second drive signal, and the second preset comparison value is half of the first period value. When the rectifier is full-bridge, there may be a phase-shift angle between the drive signals of the two bridge arms. Therefore, a corresponding drive signal may be generated based on a preset phase-shift angle.

In a possible implementation, the controller may include a phase-locked loop circuit, and perform phase-locking by using the phase-locked loop circuit. The phase-locked loop circuit includes a phase detector, a processor, and a voltage-controlled oscillator, where the phase detector is configured to obtain a phase difference, the processor is configured to obtain a corresponding voltage value based on the phase difference, and the voltage-controlled oscillator is configured to convert the voltage value into a corresponding frequency for output. A frequency and a period are reciprocals of each other. As a result, the output is a periodic signal. In the first round of phase-locking, there is no periodic signal. Therefore, the phase detector compares a current fundamental component with an initial preset periodic signal. In a non-first round of phase-locking, the phase detector obtains a phase difference between a current fundamental component and a periodic signal of a previous round.

In this embodiment, the phase-locking is performed on the current fundamental component by using the phase-locked loop circuit. An integration level of the phase-locked loop circuit is relatively high, and hardware implements phase-locking at a relatively high speed. The phase-locked loop circuit implements closed loop control. The current fundamental component serves as a reference signal of a phase-locked loop, and the periodic signal serves as a feedback signal of the phase-locked loop. The feedback signal follows the reference signal by using the phase-locked closed loop control. The periodic signal and the phase signal current fundamental component have the same frequency and the same phase. In addition, the periodic signal may also serve as the synchronization reference signal.

In the embodiment in which the phase-locked loop circuit implements the phase-locking, that the controller generates drive signals of the controllable switches of the rectifier based on the synchronization reference signal specifically comprises performing analog-to-digital conversion on the voltage value to obtain a digital voltage value, obtaining a second period value based on the digital voltage value, and generating the drive signals of the controllable switches of the rectifier based on the synchronization reference signal and a third preset comparison value, where the third preset comparison value is half of the second period value. When the phase-locked loop circuit implements phase-locking, the drive signals are generated based on the corresponding second period value that is obtained based on the voltage value output by the processor.

In the following description, whether phase-locking fails is determined by comparing periods of any two signals. In addition, that phase-locking fails may be determined by determining that a change rate of any one signal is too large. When the phase-locking fails, it indicates that the load suddenly changes, and an input current of the rectifier is asynchronous to a bridge arm current of the rectifier. As time passes, the entire wireless charging system is unsteady, and even breaks down. Therefore, when it is determined that the phase-locking fails, the receiving apparatus needs to be controlled to stop working, so as to avoid an irreparable accident.

In a possible implementation, the receiving apparatus may further include a wireless communications unit, configured to receive current period information of a transmitter coil that is sent by a transmitting apparatus. The controller determines that phase-locking fails and controls the receiving apparatus to stop working when any two of the current period information of the transmitter coil, the synchronization reference signal, and the first period value have inconsistent periods. In addition, the controller may alternatively determine that phase-locking fails and control the receiving apparatus to stop working when a change rate of at least one of the current period information of the transmitter coil, the period reference signal, or the first period value exceeds a preset rate.

In a possible implementation, the receiving apparatus may further comprise a wireless communications unit, configured to receive alternating magnetic field period information of a receiver coil that is sent by a transmitting apparatus. The controller determines that phase-locking fails and controls the receiving apparatus to stop working when any two of the alternating magnetic field period information of the receiver coil, the synchronization reference signal, and the second period value have inconsistent periods. In addition, the controller may alternatively determine that phase-locking fails and controls the receiving apparatus to stop working when a change rate of at least one of the alternating magnetic field period information of the receiver coil, the synchronization reference signal, or the second period value exceeds a preset rate.

The receiving apparatus provided above may be applied to an electric vehicle. For example, the receiving apparatus may wirelessly charge a battery pack of the electric vehicle.

In addition, the embodiment of this application further provides an electrical terminal, including an element that uses electricity, a battery, and the receiving apparatus, where the receiving apparatus is configured to charge the battery, and the battery is configured to supply power to the element that uses electricity.

When the electrical terminal is an electric vehicle, the element that uses electricity is a battery pack.

The embodiment of this application further provides a wireless charging control method, including performing phase-locking on a phase of a current fundamental component of an alternating current at an input end of a rectifier, to obtain a periodic signal having a same frequency as the current fundamental component, where when a frequency of the current fundamental component changes due to a sudden change of load, a frequency of the periodic signal does not suddenly change because the phase-locking has inertia, and generating a synchronization reference signal having the same frequency as the periodic signal, and generating drive signals of controllable switches of the rectifier based on the synchronization reference signal, where the drive signals and the current fundamental component have the same frequency. Because the drive signals determine a frequency of a bridge arm voltage of the rectifier, when the drive signals and the current fundamental component have the same frequency, the bridge arm voltage and the current fundamental component also have the same frequency. In other words, it is ensured that the bridge arm voltage is synchronized with the current fundamental component, and therefore, it can be ensured that a wireless charging system works in a steady state.

The embodiment of this application further provides a wireless charging system, including a transmitting apparatus and the receiving apparatus described above. The transmitting apparatus includes an inverter and a transmitter coil, where the inverter is configured to invert a direct current of a direct current power supply to an alternating current, and the transmitter coil is configured to transmit the electromagnetic energy to the receiving apparatus.

For application of the wireless charging system in the field of electric vehicles, the transmitting apparatus may be located on the ground, and the receiving apparatus may be located in an electric vehicle. The transmitter coil in the transmitting apparatus transmits the electromagnetic energy to the receiving apparatus located in the electric vehicle. The receiving apparatus receives the electromagnetic energy, and charges a battery pack after performing conversion.

It can be learned from the foregoing technical solutions that, the embodiments of this application have the following advantages.

In the wireless charging receiving apparatus provided in the embodiments of this application, the controller performs the phase-locking on a phase of the input current of the rectifier and locks the phase of the input current in a closed loop control manner. When the wireless charging system works in a steady state, an input signal and a feedback signal that are of phase-locked closed loop control have a same phase by mainly using an inertia stage of phase-locking control. When the load jumps, the phase or a period of the input current of the rectifier may change. However, because of the inertia stage of the phase-locking control, in a time of an oscillation transient state caused by a sudden change of the load, an output signal of the phase-locked closed loop control can still maintain a phase and a period the same as those in the steady state, thereby ensuring stable performance in the transient state. Therefore, it can be ensured that the synchronization reference signal and the fundamental component of the input current of the rectifier have a same period, namely, the same frequency. The drive signals of the controllable switches are generated by using the synchronization reference signal, so that the bridge arm voltage and the input current of the rectifier can have the same frequency. Consequently, after the phase-locking, a period of the synchronization reference signal does not change due to the sudden change of the load, and frequencies of the drive signals do not jump. According to the embodiments of this application, it can be ensured that the input current of the rectifier is synchronized with the bridge arm voltage of the rectifier, so that the entire wireless charging system works in the steady state.

DETAILED DESCRIPTION OF ILLUSTRATIVE EMBODIMENTS

To make persons skilled in the art better understand the technical solutions provided in the embodiments of this application, the following first describes how a wireless charging system applied to the field of electric vehicles works.

Figure 3:
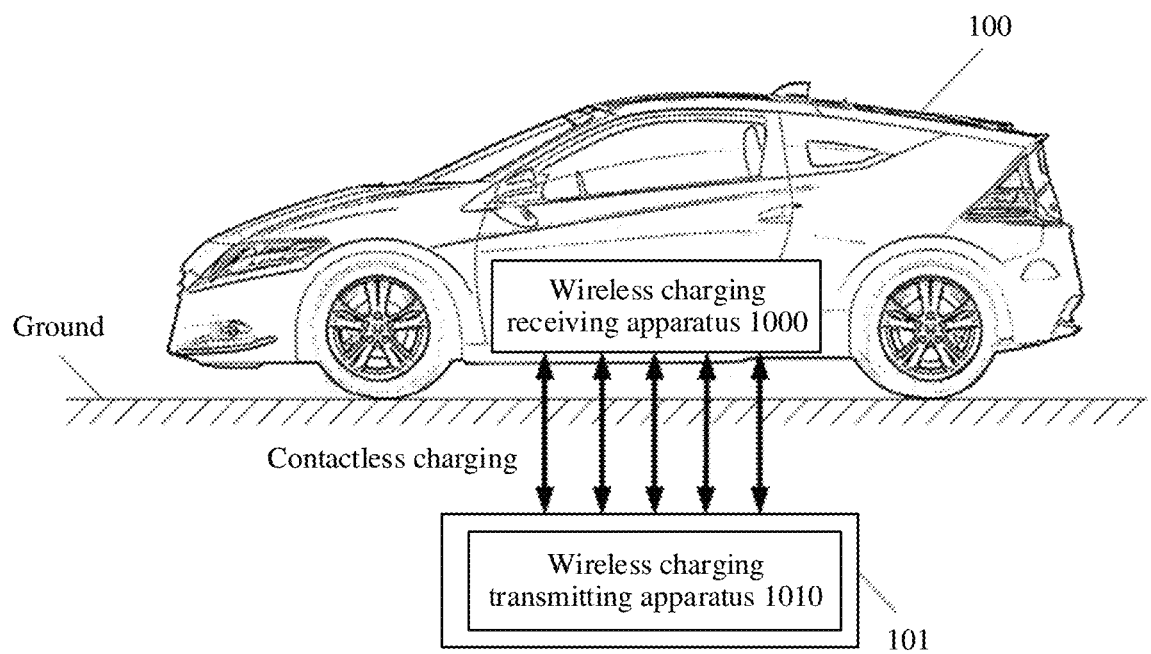
FIG. 3 is a schematic diagram of a wireless charging system for an electric vehicle according to an embodiment of this application.

FIG. 3 is a schematic diagram of a wireless charging system for an electric vehicle according to an embodiment of this application.

The wireless charging system may include at least an electric vehicle 100 and a wireless charging station 101.

The electric vehicle 100 may include a wireless charging receiving apparatus 1000, and the wireless charging station 101 may include a wireless charging transmitting apparatus 1010.

Currently, a process of charging the electric vehicle by the wireless charging system is that the wireless charging receiving apparatus 1000 in the electric vehicle 100 and the wireless charging transmitting apparatus 1010 in the wireless charging station 101 work together to perform contactless charging.

The wireless charging station 101 may specifically be a fixed wireless charging station, a fixed wireless charging parking space, a wireless charging road, or the like. The wireless charging transmitting apparatus 1010 may be disposed on the ground or buried under the ground, and may wirelessly charge the electric vehicle 100 above the wireless charging transmitting apparatus 1010.

The wireless charging receiving apparatus 1000 may specifically be integrated into the bottom of the electric vehicle 100. When the electric vehicle 100 enters a wireless charging range of the wireless charging transmitting apparatus 1010, the electric vehicle 100 may be charged in a wireless charging manner. A power receive antenna and a rectifier circuit of the wireless charging receiving apparatus 1000 may be integrated or separated. When the power receive antenna and the rectifier circuit are separated, a rectifier in the rectifier circuit is usually disposed inside the vehicle.

Figure 1:
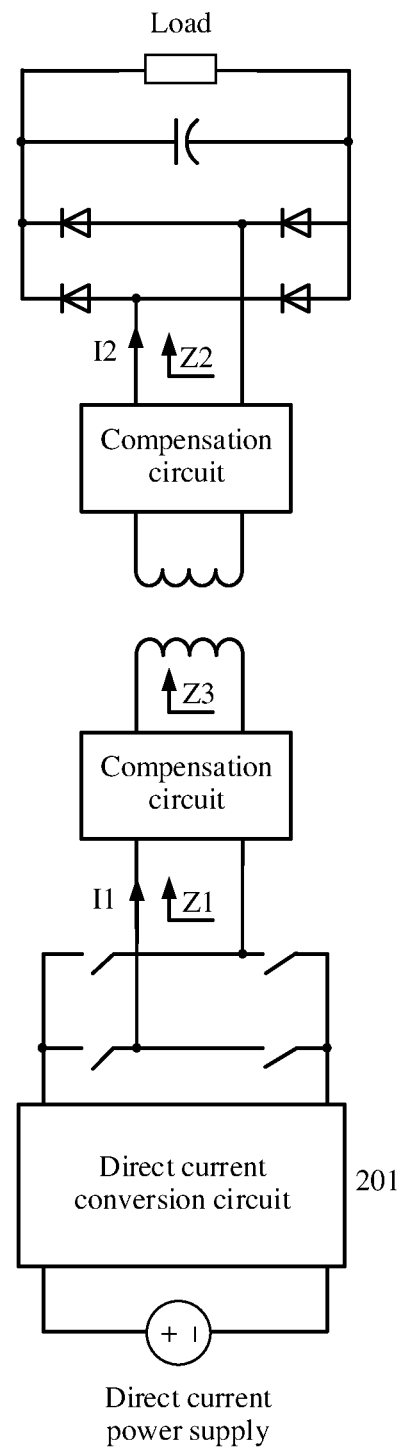
FIG. 1 is a schematic diagram of an un-tuned wireless charging system in which a direct current conversion circuit is at a transmit end.
Figure 2:
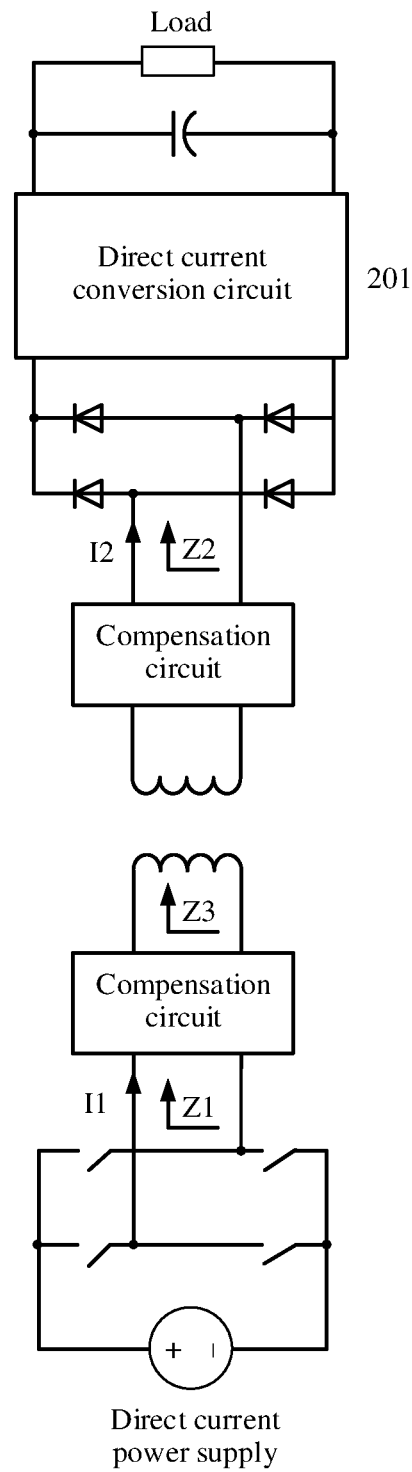
FIG. 2 is a schematic diagram of an un-tuned wireless charging system in which a direct current conversion circuit is in a receiving apparatus.

A power transmit antenna and an inverter circuit of the wireless charging transmitting apparatus 1010 may be integrated or separated. FIG. 1 shows a form in which the power transmit antenna and the inverter circuit are integrated.

In addition, the contactless charging may be wireless power transfer performed by the wireless charging receiving apparatus 1000 and the wireless charging transmitting apparatus 1010 in an electric field coupling manner or a magnetic field coupling manner, which may specifically be an electric field induction manner, a magnetic induction manner, a magnetic resonance manner, or a wireless radiation manner. This is not specifically limited in this embodiment of this application. Further, the electric vehicle 100 and the wireless charging station 101 may perform bidirectional charging. In other words, the wireless charging station 101 may charge the electric vehicle 100 by using a power supply, or the electric vehicle 100 may discharge to a power supply.

The technical solutions provided in the embodiments of this application are based on active tuning. To make persons skilled in the art better understand the technical solutions, the following describes how the active tuning works in detail with reference to the accompanying drawings.

Output power of a wireless charging system is associated with equivalent impedance of a rectifier. When an output current of the rectifier is constant, output power of the rectifier is equal to a product of the equivalent impedance of the rectifier and a square of the output current of the rectifier. Therefore, the output power of the wireless charging system may be adjusted by adjusting the equivalent impedance of the rectifier. The equivalent impedance of the rectifier is obtained by dividing a bridge arm voltage of the rectifier by an input current of the rectifier. Therefore, a premise of adjusting the equivalent impedance of the rectifier is that the bridge arm voltage is synchronized with the input current of the rectifier. When the bridge arm voltage and the input current of the rectifier are in a fluctuation state, and a phase between the bridge arm voltage and the input current cannot be locked, the output power of the wireless charging system is in an uncontrollable state. As a result, the active tuning cannot be implemented.

Figure 4:
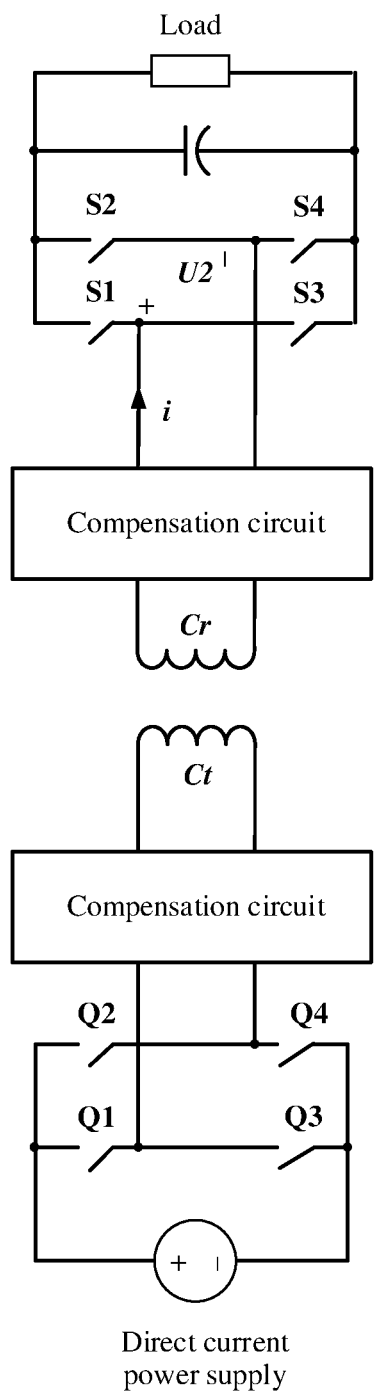
FIG. 4 is a schematic diagram of a wireless charging system that uses active tuning according to an embodiment of this application.

FIG. 4 is a schematic diagram of a wireless charging system that uses active tuning according to an embodiment of this application.

Controllable switches (S1, S2, S3, and S4) are used in a receiving apparatus of the wireless charging system that uses the active tuning. Instead of an uncontrollable diode, controllable switches such as IGBTs or MOS transistors are used in a rectifier of the receiving apparatus.

In the active tuning in which controllable switches are used in the rectifier, synchronization control of a bridge arm voltage and an input current of the rectifier of the receiving apparatus is included. However, the input current of the rectifier easily changes as load changes. Especially when the load is suddenly increased or decreased, the input current of the rectifier changes greatly, and therefore a period of a synchronized signal changes. As a result, frequencies of drive signals that drive the controllable switches jump, and the wireless charging system works unstably in a transient state, or even shuts down because protection is triggered.

To resolve the foregoing problems, the embodiments of this application provide a wireless charging receiving apparatus, to perform phase-locking on a phase of an input current of a rectifier. When a wireless charging system works in a steady state, an input signal and a feedback signal that are of phase-locked closed loop control have a same phase by using an inertia principle of the phase-locking. Therefore, when load suddenly changes, a phase of a current fundamental component obtained after the phase-locking does not jump. The phase obtained after the phase-locking is used to synchronize drive signals of controllable switches of the rectifier, so that a frequency of the current fundamental component is synchronized with a frequency of a bridge arm voltage of the rectifier. Therefore, with application of the wireless charging receiving apparatus, the input current of the rectifier can be synchronized with the bridge arm voltage of the rectifier when the load suddenly changes, thereby ensuring that the wireless charging system works in the steady state.

This application provides a wireless charging receiving apparatus that uses active tuning. The following provides descriptions with reference to the accompanying drawings. The wireless charging receiving apparatus provided in the following embodiments of this application may be applied to the wireless charging receiving apparatus 1000 corresponding to FIG. 1.

Embodiment 1

Figure 5:
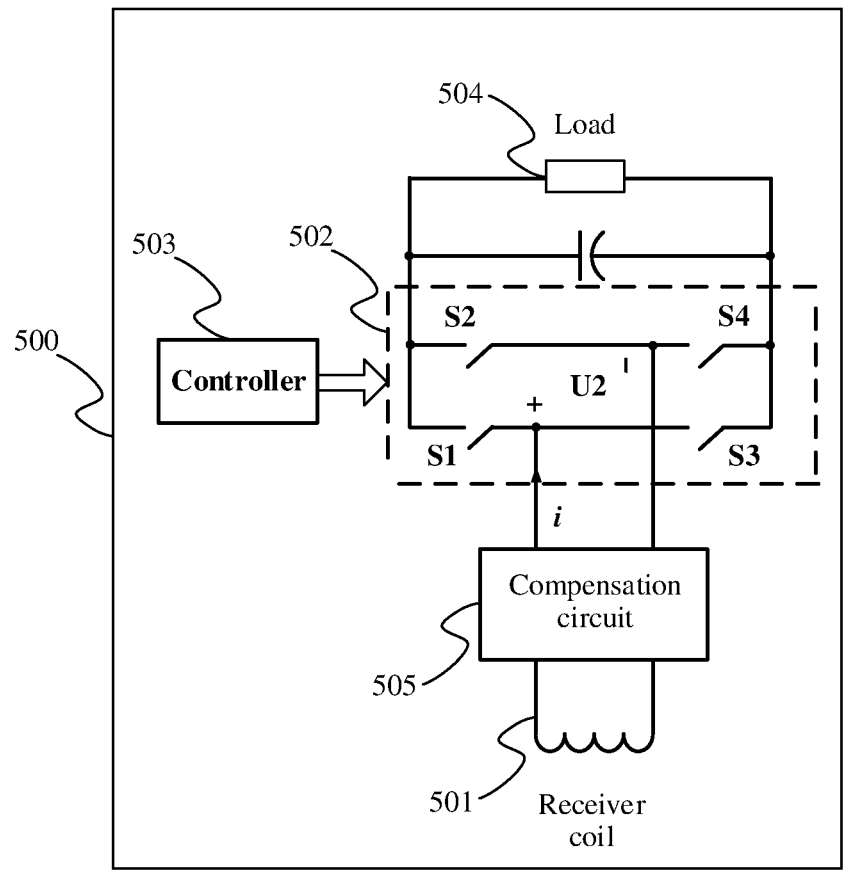
FIG. 5 is a schematic structural diagram of a wireless charging receiving apparatus according to Embodiment 1 of this application.
Figure 5:
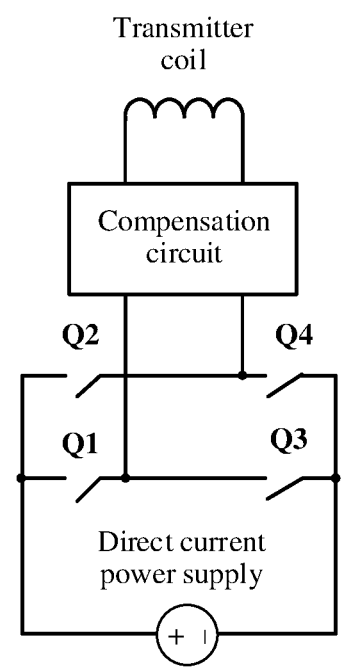

FIG. 5 is a schematic structural diagram of a wireless charging receiving apparatus according to Embodiment 1 of this application.

FIG. 5 shows a wireless charging system, and a transmit end is the same as that in FIG. 4. Details are not described herein. The technical solutions provided in the embodiments of this application are improvement of the receiving apparatus. The following mainly describes how the receiving apparatus works.

As shown in FIG. 5, a wireless charging receiving apparatus 500 provided in this embodiment of this application includes a receiver coil 501, a rectifier 502, and a controller 503. The receiving apparatus may further include load 504 and a compensation circuit 505.

An output end of the receiver coil 501 is connected to an input end of the compensation circuit 505. An output end of the compensation circuit 505 is connected to an input end of the rectifier 502. An output end of the rectifier 502 is connected to the load 504. When the wireless charging system is applied to an electric vehicle, the load may be a battery pack.

The receiver coil 501 is configured to receive electromagnetic energy transmitted by a transmitter coil and output an alternating current.

The compensation circuit 505 is configured to compensate the alternating current output by the receiver coil, eliminate an additional phase shift generated when the receiver coil 501 receives the alternating current transmitted by the transmitter coil at the transmit end, and output an alternating current obtained after compensation to the rectifier 502, so that the receiving apparatus obtains a stable alternating current.

The rectifier 502 includes at least two controllable switches, and is configured to rectify the alternating current from the receiver coil to a direct current by using the at least two controllable switches.

The rectifier 502 may be a full-bridge rectifier or a half-bridge rectifier.

In this embodiment, an example in which the rectifier 502 is a full-bridge rectifier, and four switches in the full-bridge rectifier are all controllable switches is used for description. As shown in FIG. 5, the rectifier includes controllable switches S1, S2, S3, and S4.

The controller 503 is further configured to generate a synchronization reference signal having a same frequency as the periodic signal, generate drive signals of the controllable switches in the rectifier 502 based on the synchronization reference signal, and control, based on the drive signals, the controllable switches in the rectifier 502 to convert the alternating current into the direct current, where the drive signals and the current fundamental component have a same frequency.

Because an input current of the rectifier 502 that is directly sampled includes a harmonic, a fundamental component of the input current of the rectifier 502 needs to be extracted, and the fundamental component does not include the harmonic. The controller 503 controls a bridge arm voltage of the rectifier 502 to be synchronized with the input current of the rectifier 502, and this means that the controller 503 controls a period of the bridge arm voltage of the rectifier 502 to be synchronized with a period of the fundamental component. The bridge arm voltage of the rectifier 502 and the drive signals of the controllable switches in the rectifier have the same period. Therefore, the drive signals may be controlled to have the same period as the current fundamental component. In addition, because a frequency is a reciprocal of a period, the drive signals may be controlled to have the same frequency as the current fundamental component. The bridge arm voltage of the rectifier 502 is a voltage between two bridge arm midpoints. When the rectifier 502 is half-bridge and has only one bridge arm, the bridge arm voltage is a voltage between a bridge arm midpoint and the ground.

Because of a hardware circuit that samples the input current of the rectifier 502, a phase of the input current that is sampled lags behind a phase of an actual input current. A difference by which the phase of the input current that is sampled lags behind the phase of the actual input current depends on a specific structure and a specific parameter of the hardware circuit that performs sampling.

The periodic signal may be a periodic signal in a square wave form or a sine wave form. This is not specifically limited in this embodiment of this application. A phase difference between the periodic signal and the current fundamental component is fixed in each period, and the fixed phase difference may be 0 or another value.

The synchronization reference signal and the periodic signal have the same frequency, namely, a same period. In addition, there may be a fixed phase difference between the synchronization reference signal and the periodic signal, and the fixed phase difference may be 0 or another value.

The drive signals of the controllable switches in the rectifier 102 are generated based on the synchronization reference signal, and the drive signals are pulse-width modulation (PWM) signals. Referring to the controllable switches shown in FIG. 5, the drive signals in this embodiment of this application may specifically include a first PWM drive signal and a second PWM drive signal. The first PWM drive signal may be used to drive the controllable switches S1 and S3, and the second PWM drive signal may be used to drive the controllable switches S2 and S4. The first PWM drive signal and the second PWM drive signal each have the same period as the periodic signal, and there is an adjustable phase-shift angle θ between the first PWM drive signal and the second PWM drive signal. The phase-shift angle θ, namely, a phase-shift angle between a front bridge arm and a rear bridge arm of the rectifier 502 may be adjusted to implement a phase shift function of the drive signals.

For phase-locking control, the periodic signal serves as a feedback signal, and the current fundamental component serves as a reference signal. Subtraction is performed between the phase of the periodic signal and the phase of the current fundamental component to obtain the phase difference. The periodic signal is controlled based on the phase difference, so that the periodic signal follows the current fundamental component. To be specific, the phase of the periodic signal follows the phase of the fundamental component of the input current of the rectifier, and the period of the periodic signal is synchronized with the period of the fundamental component of the input current of the rectifier.

In the wireless charging receiving apparatus provided in this embodiment of this application, the controller performs phase-locking on the phase of the input current of the rectifier and locks the phase of the input current in a closed loop control manner. When the wireless charging system works in a steady state, an input signal and a feedback signal that are of phase-locked closed loop control have a same phase by mainly using an inertia stage of the phase-locking control. When the load jumps, the phase or a period of the input current of the rectifier may change. However, because of the inertia stage of the phase-locking control, in a time of an oscillation transient state caused by a sudden change of the load, an output signal of the phase-locked closed loop control can still maintain a phase and a period the same as those in the steady state, thereby ensuring stable performance in the transient state. Therefore, it can be ensured that the synchronization reference signal and the fundamental component of the input current of the rectifier have the same period, namely, the same frequency. The drive signals of the controllable switches are generated by using the synchronization reference signal, so that the bridge arm voltage and the input current of the rectifier can have a same frequency. Consequently, after the phase-locking, the period of the synchronization reference signal does not change due to the sudden change of the load, the frequencies of the drive signals do not jump, and the drive signals and the bridge arm voltage have the same period. When the drive signals and the synchronization reference signal have the same period, it can be ensured that the input current of the rectifier is synchronized with the bridge arm voltage of the rectifier, so that the entire wireless charging system works in the steady state.

Embodiment 2

The following specifically describes how the controller performs phase-locking on the current fundamental component to obtain the periodic signal with reference to the accompanying drawing.

Figure 6:
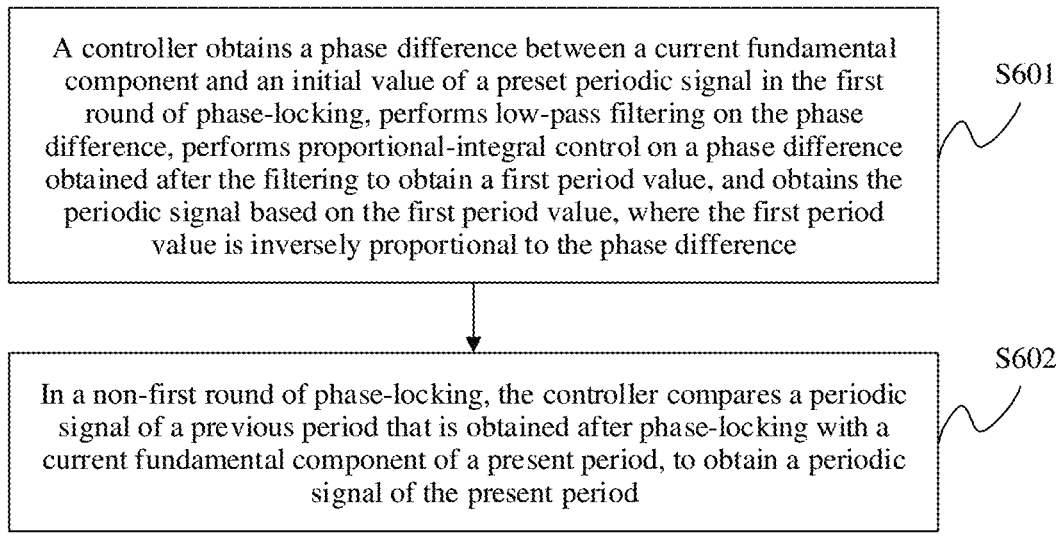
FIG. 6 is a flowchart of a method for obtaining a periodic signal according to Embodiment 2 of this application.

FIG. 6 is a flowchart of a method for obtaining a periodic signal according to Embodiment 2 of this application.

The controller performs the phase-locking on the current fundamental component by performing the following steps to obtain the periodic signal.

S601. The controller obtains a phase difference between a current fundamental component and an initial preset periodic signal that are of the first round of phase-locking, performs low-pass filtering on the phase difference, performs proportional-integral control on a phase difference obtained after the filtering to obtain a first period value, and obtains, based on the first period value, a periodic signal corresponding to the first round of phase-locking, where the first period value is inversely proportional to the phase difference.

Phase-locking control performed by the controller belongs to closed loop feedback control, where the current fundamental component serves as an input reference signal of the closed loop control, and the periodic signal serves as a feedback signal of the closed loop control. However, in the first period in which the controller is powered on to work, the closed loop control has no periodic signal that has been output. Therefore, in the first round of phase-locking, the initial preset periodic signal is compared, as a feedback signal, with the current fundamental component, to obtain a phase difference between the current fundamental component and the initial preset periodic signal that are of the first round of phase-locking. The first round of phase-locking is phase-locking in the first period.

The initial preset periodic signal may be set based on a period value of an input current, and generally, the initial preset periodic signal may be set to any value provided that a phase difference between the initial preset periodic signal and the fundamental component of the input current is in a preset range. For example, if a frequency of the fundamental component of the input current is 85 kHz, the initial preset periodic signal may be set to 80 kHz. When load suddenly changes, the frequency of the fundamental component of the input current may change to 83 kHz.

The first period value may be obtained by using a counter. The counter in the controller counts from 0 to the first period value. When the counter counts to the first period value, the counter is reset to 0 and re-counts from 0. Therefore, a change of a count value of the counter presents a triangle wave form with time.

The first period value corresponds to a period. To be specific, a corresponding periodic signal may be obtained by using the first period value.

A process in which the controller performs phase-locking is a closed loop control process, and in S601, the controller performs only the first round of phase-locking in the first period. After the first round of phase-locking is completed, a periodic signal is generated. Subsequently in S602, a periodic signal generated in a previous period is compared with a current fundamental component to obtain a phase difference between the periodic signal and the current fundamental component, a corresponding period value is obtained based on the phase difference, and a periodic signal of a present period is obtained based on the period value.

S602. In a non-first round of phase-locking, the controller compares the periodic signal of the previous period that is obtained after phase-locking with the current fundamental component, to obtain the periodic signal of the present period.

A difference between S602 and S601 lies only in objects compared with a current fundamental component. In S601, the initial preset periodic signal is compared with the current fundamental component, while in S602, the periodic signal of the previous period is compared with the current fundamental component. Other descriptions are the same.

The following uses the non-first round of phase-locking as an example for description, and the first period value is inversely proportional to the phase difference.

If the phase of the current fundamental component leads a phase of the periodic signal, the phase difference is positive. Therefore, the first period value should be decreased, and a frequency of the periodic signal should be increased, so that the phase of the periodic signal is closer to the phase of the current fundamental component.

If the phase of the current fundamental component lags behind a phase of the periodic signal, the phase difference is negative. Therefore, the first period value should be increased, and a frequency of the periodic signal should be decreased, so that the phase of the periodic signal is closer to the phase of the current fundamental component.

In this embodiment of this application, the controller is used to perform the phase-locking on the current fundamental component to obtain the periodic signal. Phase-locking control belongs to a closed loop control process. The periodic signal serves as the feedback signal, and the current fundamental component serves as the reference signal. The feedback signal is compared with the reference signal to obtain a phase difference between the feedback signal and the reference signal. Then, the first period value is obtained based on the phase difference. The periodic signal is obtained based on the first period value, so that the periodic signal and the current fundamental component can have a same frequency, and the phase difference can be fixed. Because of an inertia feature of the phase-locking, the periodic signal has an anti-interference capability. When a relatively great change occurs in a current that is in a transient state and that is of the receiving apparatus because of a sudden increase or decrease of the load or for another reason, the frequency of the periodic signal does not suddenly fluctuate accordingly, so that the wireless charging system works in a steady state.

Embodiment 3

The foregoing embodiment describes a specific process in which the controller obtains the periodic signal. The following specifically describes how the controller generates the synchronization reference signal having the same frequency as the periodic signal with reference to the accompanying drawings. In this embodiment, there may be a fixed phase difference between the synchronization reference signal and the periodic signal, and the fixed phase difference may be 0 or another value. When the fixed phase difference is 0, the synchronization reference signal and the periodic signal have the same frequency and a same phase. When the fixed phase difference is another value, the synchronization reference signal and the periodic signal have the same frequency, but different phases.

Figure 7:
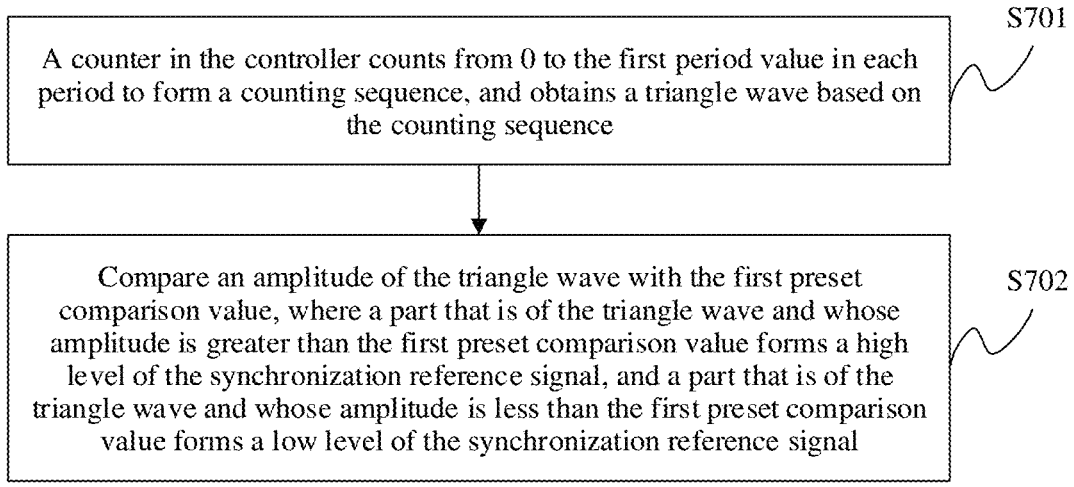
FIG. 7 is a flowchart of a method for generating a synchronization reference signal according to Embodiment 3 of this application.

FIG. 7 is a flowchart of a method for generating, by a controller, a synchronization reference signal according to Embodiment 3 of this application.

Figures 8, 9:
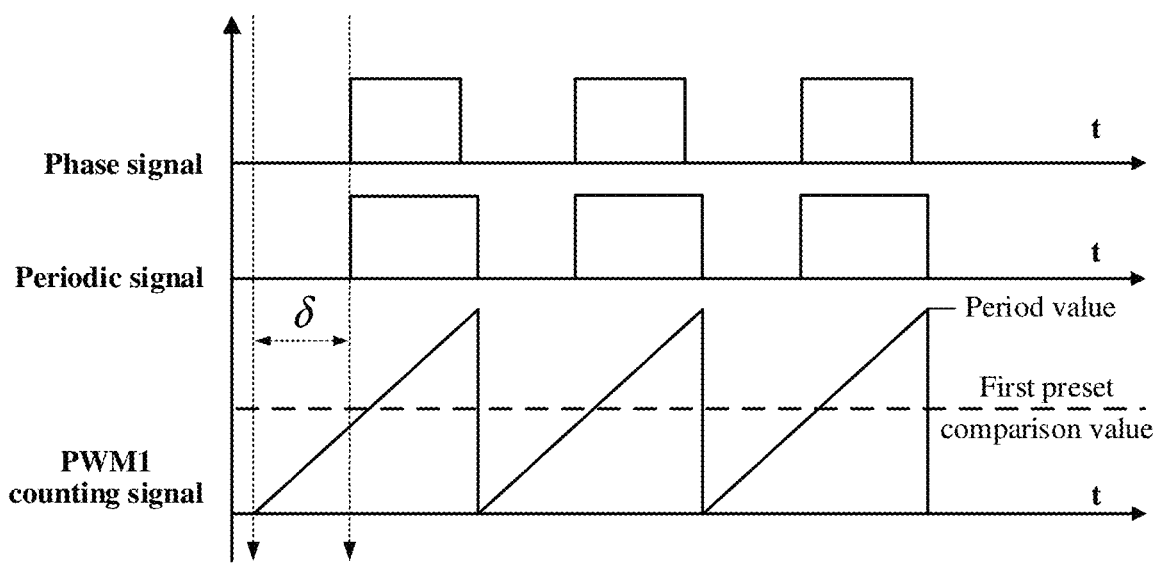
FIG. 8 is a schematic diagram of generating a signal according to Embodiment 3 of this application.
FIG. 9 is a flowchart of a method for generating a drive signal of a switch according to Embodiment 4 of this application.

FIG. 8 shows a signal waveform according to Embodiment 3 of this application.

That the controller generates a synchronization reference signal having the same frequency as the periodic signal is specifically the controller is configured to obtain the synchronization reference signal based on the first period value and a first preset comparison value, where the first preset comparison value is used to adjust a phase difference between the periodic signal and the synchronization reference signal.

That the controller is configured to obtain the synchronization reference signal based on the first period value and a first preset comparison value is specifically described in S701 and S702.

S701. A counter in the controller counts from 0 to the first period value in each period to form a counting sequence, and obtains a triangle wave based on the counting sequence.

S702. The controller is configured to compare an instantaneous value of the triangle wave with the first preset comparison value, where a part that is of the triangle wave whose instantaneous value is greater than the first preset comparison value forms a high level of the synchronization reference signal, and a part that is of the triangle wave whose instantaneous value is less than the first preset comparison value forms a low level of the synchronization reference signal.

Specifically, referring to the waveform shown in FIG. 8, a waveform of a PWM1 counting signal is a triangle wave, and a horizontal dashed line that intersects with the triangle wave represents the first preset comparison value. The counter in the controller generates the triangle wave. A PWM1 counting signal in each period corresponds to one counting period, and in each counting period, the counter counts from 0 to the first period value. A change of a count value presents a triangular wave form with time. When counting to data corresponding to the first period value, the counter is reset to 0, and starts to count again in a next counting period. A crest value of the PWM1 counting signal in FIG. 8 is the first period value. The synchronization reference signal carries the first period value.

In FIG. 8, δ is used to represent a phase difference between the periodic signal and the PWM1 counting signal, and the phase difference is associated with the first preset comparison value. As shown in FIG. 8, the first preset comparison value increases, and the corresponding horizontal dashed line moves upward. In this case, the phase difference δ between the periodic signal and the PWM1 counting signal becomes larger. The first preset comparison value decreases, and the corresponding horizontal dashed line moves downward. In this case, the phase difference δ between the periodic signal and the PWM1 counting signal becomes smaller. It can be learned that, the phase difference between the periodic signal and the synchronization reference signal may be adjusted by adjusting the first preset comparison value.

In FIG. 8, a synchronization reference signal is always generated at a moment at which the counter is 0. Alternatively, a synchronization reference signal may be generated at a moment at which the counter counts to other data. A moment at which the count value of the counter is equal to the first preset comparison value is a rising edge moment of the periodic signal. Therefore, the phase difference between the periodic signal and the synchronization reference signal may be adjusted by adjusting the first preset comparison value.

In this embodiment of this application, the controller obtains the synchronization reference signal based on the first period value and the first preset comparison value. The first preset comparison value is set based on the phase difference between the periodic signal and the synchronization reference signal. The controller may obtain the PWM1 counting signal by performing counting based on the first period value, and obtain the corresponding triangle wave by periodically performing counting. The controller compares the triangular wave with the first preset value to generate the synchronization reference signal. In addition, the phase difference between the periodic signal and the PWM1 counting signal may be adjusted by adjusting the first preset comparison value, and the synchronization reference signal carries the period value and the phase difference.

Embodiment 4

The following specifically describes how the controller generates the drive signals of the controllable switches in the rectifier based on the synchronization reference signal with reference to the accompanying drawings.

In this embodiment, an example in which the rectifier is a full-bridge rectifier and includes two bridge arms is used, and that the controller generates the drive signals of the controllable switches in the rectifier based on the synchronization reference signal specifically includes the following.

The controller generates a first drive signal of controllable switches on a front bridge arm of the full-bridge rectifier and a second drive signal of controllable switches on a rear bridge arm of the full-bridge rectifier based on the synchronization reference signal, a phase-shift angle between the two bridge arms of the full-bridge rectifier, and a second preset comparison value, where a phase difference between the first drive signal and the second drive signal is the phase-shift angle, and the second preset comparison value is half of the first period value.

FIG. 9 is a flowchart of a method for generating, by a controller, a drive signal of a switch according to Embodiment 4 of this application.

The controller generates the drive signal by performing the following steps.

S901. The controller generates the drive signals of the controllable switches in the rectifier based on the synchronization reference signal and the second preset comparison value.

In this embodiment of this application, an example in which the rectifier is the full-bridge rectifier and includes four switches S1, S2, S3, and S4 is used for description. A first PWM drive signal may be used to drive the switches S1 and S3, and a second PWM drive signal may be used to drive the switches S2 and S4. The first PWM drive signal and the second PWM drive signal each have a same period value as the periodic signal.

Figure 10:
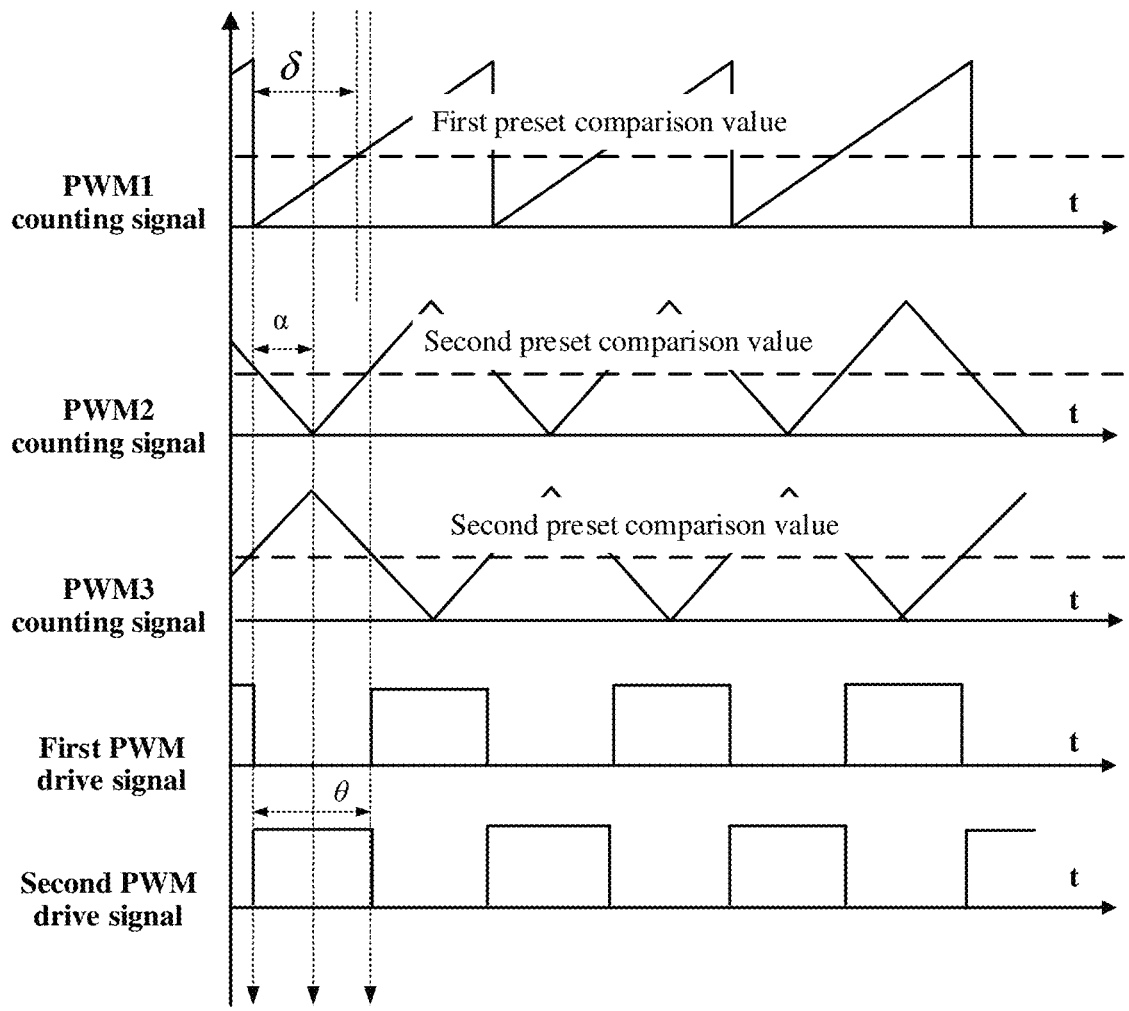
FIG. 10 is a schematic diagram of generating drive signals of a rectifier according to Embodiment 4 of this application.

FIG. 10 is a schematic diagram of generating drive signals of a rectifier according to Embodiment 4 of this application.

In this embodiment of this application, an example in which the first preset comparison value is half of the first period value, to be specific, a phase difference between the periodic signal and the synchronization reference signal is half a period. In addition, another value may be selected as the first preset comparison value. This is not specifically limited in this embodiment.

The synchronization reference signal carries information about the PWM1 counting signal. For ease of understanding, the following provides descriptions with reference to the waveform of the PWM1 counting signal.

A principle of generating, by the counter of the controller, a PWM2 counting signal and a PWM3 counting signal is the same as that of generating the PWM1 counting signal. Details are not described herein. For differentiation, the PWM1 counting signal corresponds to a PWM1 counter, the PWM2 counting signal corresponds to a PWM2 counter, and the PWM3 counting signal corresponds to a PWM3 counter.

The PWM2 counting signal and the PWM3 counting signal each have a same period value as the PWM1 counting signal. When the PWM1 counter is a preset value, the PWM2 counter and the PWM3 counter are synchronized. An initial location at which the PWM2 counting signal is 0 and an initial location at which the PWM3 counting signal is 0 each are shifted in phase by an angle α with respect to an initial location at which the PWM1 counting signal is 0, where a is greater than or equal to 0 and is less than the period value. A value of the angle α is not specifically limited in this embodiment of this application.

As shown in FIG. 10, the PWM3 counting signal is shifted in phase by half a period with respect to the PWM2 counting signal. It may be understood that, the PWM3 counting signal may also be shifted in phase by another angle with respect to the PWM2 counting signal.

The first PWM drive signal and the second PWM drive signal may be generated based on the second preset comparison value by using the PWM2 counting signal and the PWM3 counting signal respectively. The second preset comparison value and the first preset comparison value may be the same or different. FIG. 10 is a schematic diagram of generating a drive signal when the second preset comparison value and the first preset comparison value are the same.

The PWM2 counting signal and the PWM3 counting signal are compared with the second preset comparison value to output the first PWM drive signal and the second PWM drive signal respectively. When the second preset comparison value is half of the first period value, the PWM2 counting signal is greater than the second preset comparison value for half of one period, and therefore, a duty cycle of the first PWM drive signal is 50%, the PWM3 counting signal is greater than the second preset comparison value for half of one period, and therefore, a duty cycle of the second PWM drive signal is 50%. A phase difference between the first PWM drive signal and the second PWM drive signal is θ, where θ is a phase-shift angle between the front bridge arm and the rear bridge arm of the rectifier.

In this embodiment of this application, the controller generates the drive signals of the controllable switches in the rectifier based on the synchronization reference signal, and changes, by adjusting the second preset comparison value, the duty cycles of the first PWM drive signal and the second PWM drive signal that are generated.

Embodiment 5

The foregoing embodiments of this application describe how the receiving apparatus works. The following specifically describes, with reference to the accompanying drawing, how an input current of the rectifier is sampled and how a current fundamental component is obtained by using the input current. In this embodiment, a peripheral circuit other than the controller performs sampling, filtering, and zero-crossing detection on the input current of the rectifier.

Figure 11:
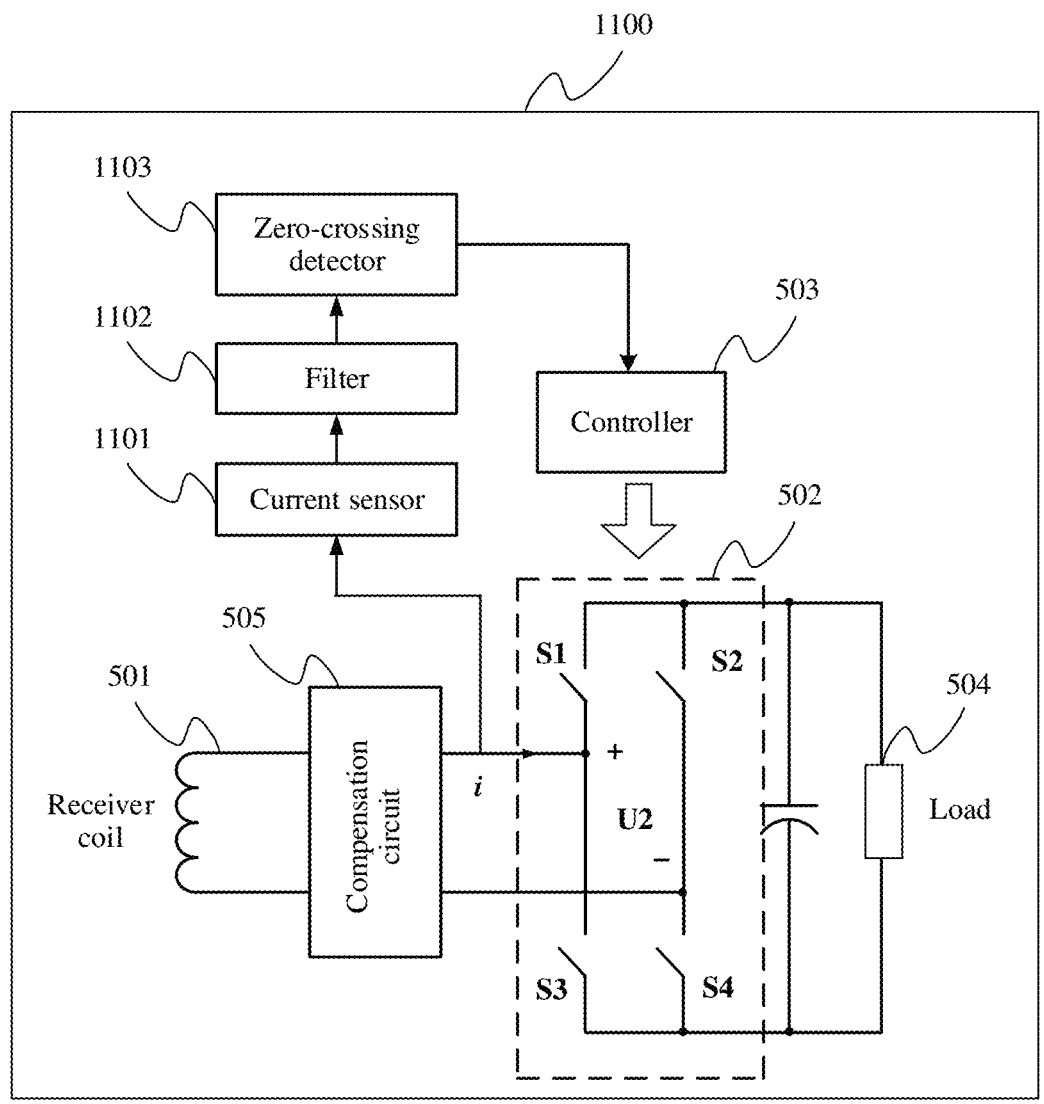
FIG. 11 is a schematic structural diagram of a wireless charging receiving apparatus according to Embodiment 5 of this application.

FIG. 11 is a schematic structural diagram of a wireless charging receiving apparatus according to Embodiment 5 of this application.

In addition to the receiver coil 501, the rectifier 502, and the controller 503, the receiving apparatus 1100 further includes a current sensor 1101, a filter 1102, and a zero-crossing detector 1103.

The current sensor 1101 is configured to detect an input current i of the rectifier 502.

The current sensor 1101 may specifically be a Hall current sensor, a current transformer CT, or a current detection circuit of another type. This is not limited in this embodiment of this application.

The filter 1102 is configured to filter the input current obtained by the current sensor 1101, to obtain a current signal representing a phase of a fundamental component of the input current of the rectifier.

A filter may filter out a high-order harmonic of an input current, and retain only a fundamental component of the input current. In this embodiment of this application, the filter 1102 may be a hardware filter. Because a device of the hardware filter causes a phase difference between an output signal and an input signal, there is a phase difference between an obtained current fundamental component and an actual fundamental component of the input current of the rectifier. Therefore, the current signal representing the phase of the fundamental component of the input current is obtained. The phase difference may be obtained by using a parameter and a structure of the hardware filter, and the controller may subsequently compensate for the phase difference.

The zero-crossing detector 1103 is configured to perform zero-crossing detection on the current signal output by the filter to obtain the current fundamental component.

The current signal output by the hardware filter is an analog sinusoidal signal. The zero-crossing detector 1103 performs the zero-crossing detection on the analog sinusoidal signal to obtain a square wave current fundamental component, where the square wave current fundamental component is a digital signal. The square wave current fundamental component serves as an input signal of the controller 503.

In this embodiment of this application, the current sensor, the filter, and the zero-crossing detector are added between the controller and the rectifier. The filter filters out the high-order harmonic in the input current of the rectifier, and the zero-crossing detector performs the zero-crossing detection on an input current obtained after filtering, to obtain a current fundamental component representing the fundamental component of the input current. It is easier to generate a square wave signal by using the current fundamental component that is obtained by processing the input current of the rectifier, and there is a fixed phase difference between the current fundamental component and the input current. The phase difference may be compensated by the controller, and a current fundamental component obtained after compensation and the actual fundamental component of the input current have a same phase.

Embodiment 6

This embodiment of this application further provides another wireless charging receiving apparatus, where a phase-locked loop circuit is integrated into a controller of the receiving apparatus, and the phase-locked loop circuit implements phase-locking on a current fundamental component. For the phase-locked loop circuit, a periodic signal and a synchronization reference signal are signals having a same frequency and a same phase. That is, the periodic signal and the synchronization reference signal may be a same signal. The following specifically describes how the receiving apparatus works with reference to the accompanying drawings.

Figure 12:
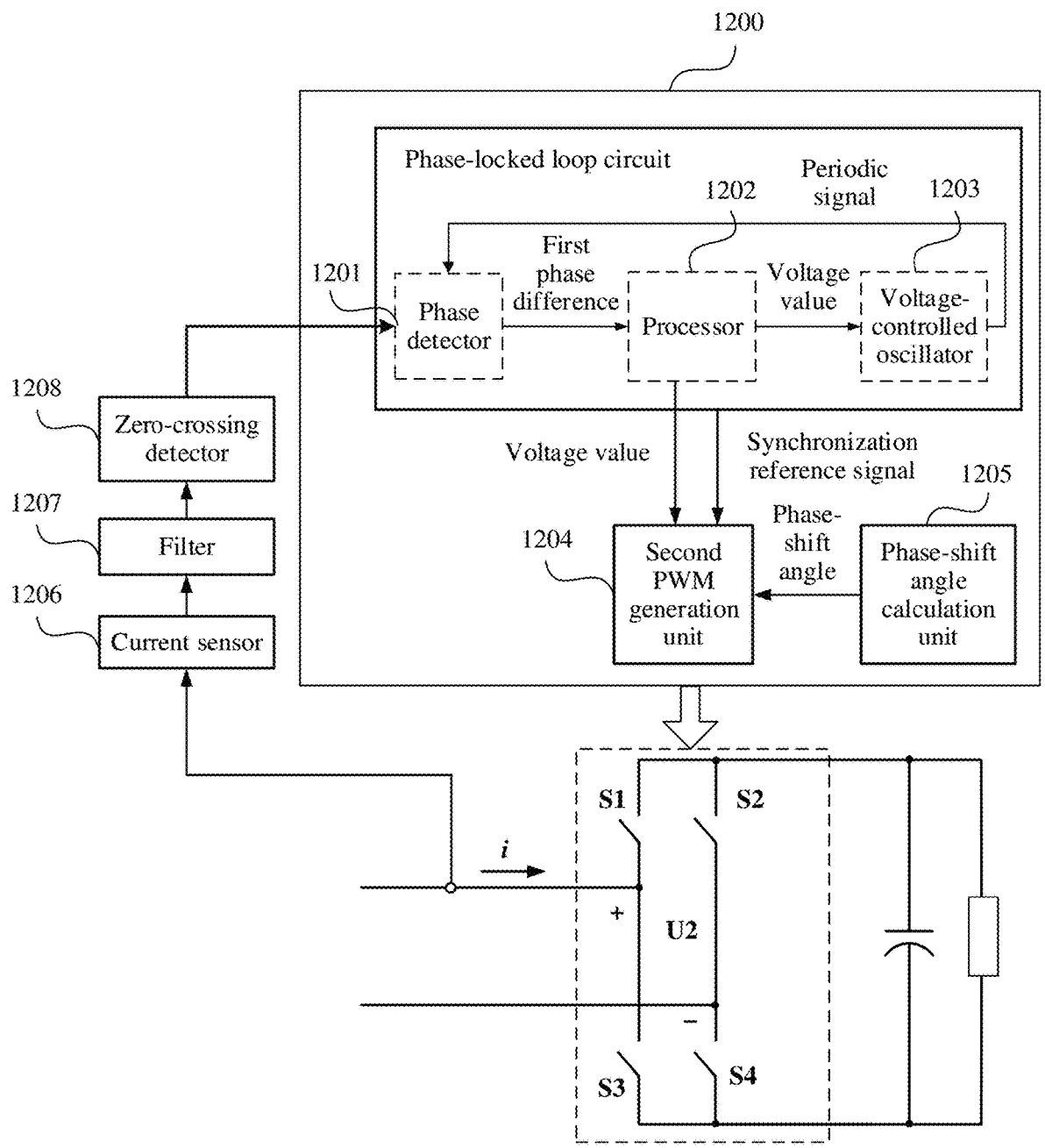
FIG. 12 is a schematic structural diagram of a wireless charging receiving apparatus according to Embodiment 6 of this application.

FIG. 12 is a schematic structural diagram of a wireless charging receiving apparatus according to Embodiment 6 of this application.

The receiving apparatus includes a controller 1200, a current sensor 1206, a filter 1207, and a zero-crossing detector 1208.

The controller 1200 specifically includes a phase detector 1201, a processor 1202, a voltage-controlled oscillator 1203, a second PWM generation unit 1204, and a phase-shift angle calculation unit 1205, where the phase detector 1201, the processor 1202, and the voltage-controlled oscillator 1203 belong to a phase-locked loop circuit.

The current sensor 1206 is configured to detect an input current i of the rectifier.

The current sensor 1206 may specifically be a Hall current sensor, a current transformer CT, or a current detection circuit of another type. This is not limited in this embodiment of this application.

The filter 1207 is configured to filter the input current detected by the current sensor, to obtain a current signal representing a phase of a fundamental component of the input current.

A filter may filter out a high-order harmonic of an input current, and retain only a fundamental component of the input current. In this embodiment of this application, the filter 1207 may be a hardware filter. Because a device of the hardware filter causes a phase difference between an output signal and an input signal, there is a phase difference between an obtained current fundamental component and an actual current fundamental component of the rectifier. The phase difference may be obtained by using a parameter and a structure of the hardware filter, and the controller may subsequently compensate for the phase difference.

The zero-crossing detector 1103 is configured to perform zero-crossing detection on the current signal output by the filter to obtain the current fundamental component.

The current signal output by the hardware filter is an analog sinusoidal signal. The zero-crossing detector 1103 performs the zero-crossing detection on the analog sinusoidal signal to obtain a square wave current fundamental component, where the square wave current fundamental component is a digital signal.

The phase detector 1201 is configured to obtain a phase difference between the current fundamental component and an initial preset periodic signal that are of the first round of phase-locking.

The processor 1202 is configured to perform low-pass filtering on the phase difference of the first round of phase-locking and obtain a voltage value of the first round of phase-locking based on a phase difference obtained after the low-pass filtering.

The voltage-controlled oscillator 1203 is configured to obtain a periodic signal of the first round of phase-locking based on the voltage value of the first round of phase-locking.

The phase detector 1201 is configured to in a non-first round of phase-locking, obtain a phase difference between a periodic signal of a previous period that is obtained after phase-locking and a current fundamental component of a present period, the processor 1202 is configured to obtain a voltage value of the present period based on the phase difference of the present period, and the voltage-controlled oscillator is configured to obtain a periodic signal of the present period based on the voltage value of the present period.

It should be noted that, the current fundamental component output by the zero-crossing detector 1103 is an input signal of the phase-locked loop circuit. In other words, the current fundamental component serves as a reference signal of closed loop control performed by the phase-locked loop circuit. An output signal of the voltage-controlled oscillator serves as a feedback signal of the closed loop control. A phase of the feedback signal follows a phase of the reference signal by using the closed loop control. The closed loop control is to enable a periodic signal that is output by the voltage-controlled oscillator 1203 to be a signal having the same frequency and the same phase as a current fundamental component that is input to the phase detector 1201.

The second PWM generation unit 1204 is configured to generate a PWM2 counting signal and a PWM3 counting signal, where the PWM2 counting signal is used to generate a first PWM drive signal to drive controllable switches S1 and S3, and the PWM3 counting signal is used to generate a second PWM drive signal to drive controllable switches S2 and S4. The PWM2 counting signal and the PWM3 counting signal may be converted based on a second preset comparison value, to generate the first PWM drive signal and the second PWM drive signal.

The PWM2 counting signal and the PWM3 counting signal each have the same period value as a synchronization reference signal, and the PWM3 counting signal is shifted in phase by half a period with respect to the PWM2 counting signal.

The phase-shift angle calculation unit 1205 is configured to calculate a phase-shift angle θ between a front bridge arm and a rear bridge arm of the rectifier, and send the phase-shift angle θ to the second PWM generation unit. The second PWM generation unit generates drive signals of the controllable switches based on the phase-shift angle θ and the synchronization signal.

Figure 13:
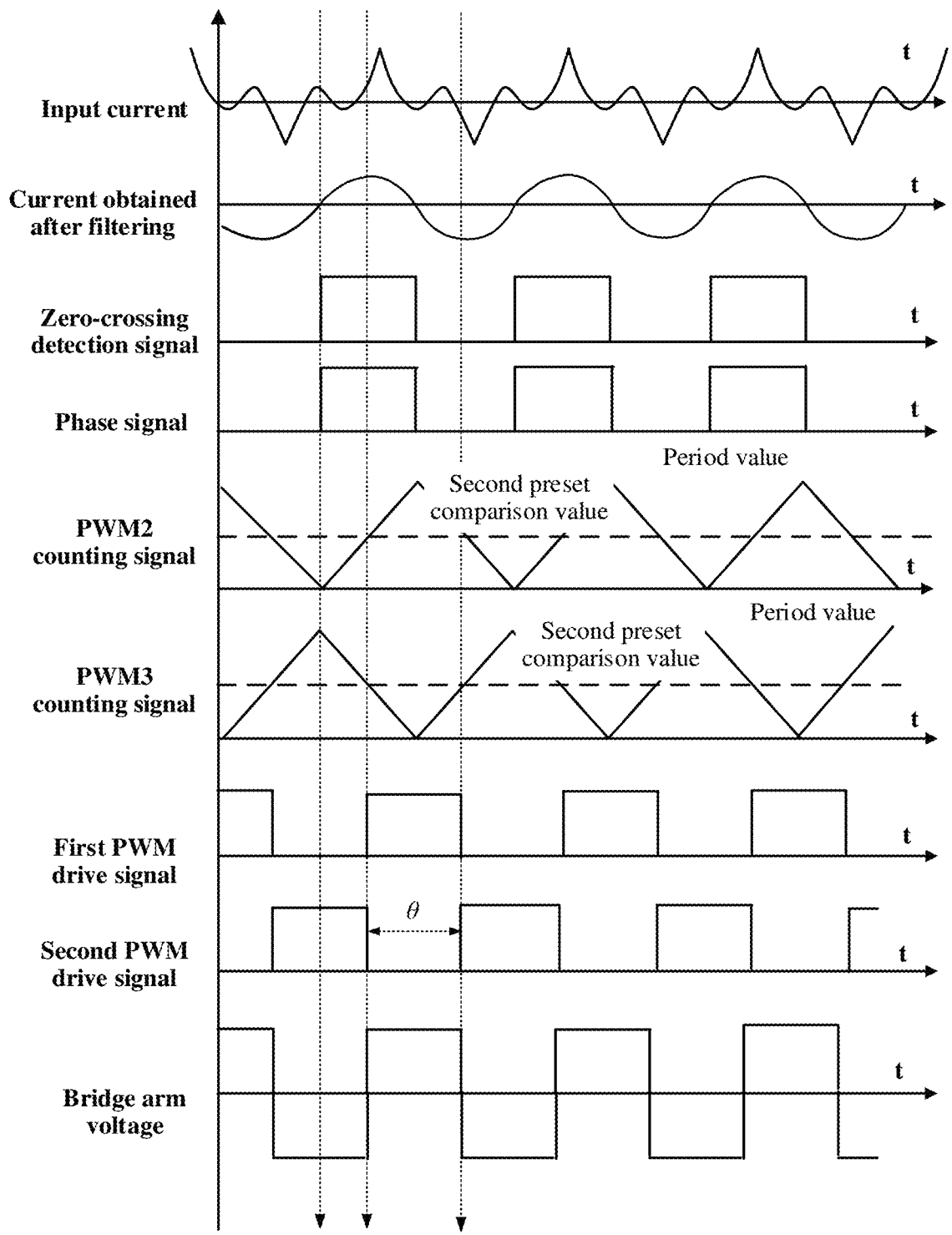
FIG. 13 is a schematic diagram of relationships between signals of active tuning in which a phase-locked loop is used for phase-locking control according to Embodiment 6 of this application.

FIG. 13 shows a waveform of each signal corresponding to FIG. 12.

As shown in FIG. 13, a waveform of a current obtained after the filtering is corresponding to a sinusoidal signal. The zero-crossing detector performs the zero-crossing detection on the current obtained after the filtering, and a signal obtained after the zero-crossing detection is a square wave signal. The square wave signal serves as the current fundamental component.

The periodic signal that is output by the voltage-controlled oscillator serves as the feedback signal of the closed loop control, and a phase of the periodic signal follows the phase of the reference signal. In other words, when the control is steady, the periodic signal that is output by the voltage-controlled oscillator is the signal having the same frequency and the same phase as the current fundamental component.

In FIG. 13, an example in which the second preset comparison value is half of a period value is still used to generate the first PWM drive signal and the second PWM drive signal. In this case, the first PWM drive signal and the second PWM drive signal have a same frequency and each have a duty cycle of 50%. In addition, a phase-shift angle is 90 degrees. A waveform of a bridge arm voltage is obtained by superimposing waveform diagrams of the first PWM drive signal and the second PWM drive signal. Another value may be selected as the phase-shift angle. This is not specifically limited in this embodiment.

In this embodiment of this application, phase-locking is directly performed by using the phase-locked loop circuit. The phase-locked loop circuit includes the phase detector, the processor, and the voltage-controlled oscillator, has a relatively high integration level, and is easy to control. The phase-locked loop circuit implements the closed loop control. The current fundamental component serves as a reference signal of a phase-locked loop, and the periodic signal serves as a feedback signal of the phase-locked loop. The feedback signal follows the reference signal by using phase-locked closed loop control. In other words, the periodic signal and the current fundamental component have the same frequency and the same phase. In addition, the periodic signal may also serve as the synchronization reference signal. The receiving apparatus provided in this embodiment can lock a phase of the input current of the rectifier, and the synchronization reference signal does not change when load suddenly changes, for example, the load is suddenly increased or decreased, so that the bridge arm voltage of the rectifier is synchronized with the input current of the rectifier, thereby facilitating steady operation of a wireless charging system.

Embodiment 7

A phase detector of a phase-locked loop circuit can process both an analog signal and a digital signal. In the embodiment corresponding to FIG. 12, the current fundamental component received by the phase-locked loop circuit is a square wave signal, namely, a digital signal. In this embodiment, an implementation of processing, by the phase detector, an analog signal is described. In this embodiment, a part that is the same as that in FIG. 12 is not described herein.

Figure 14:
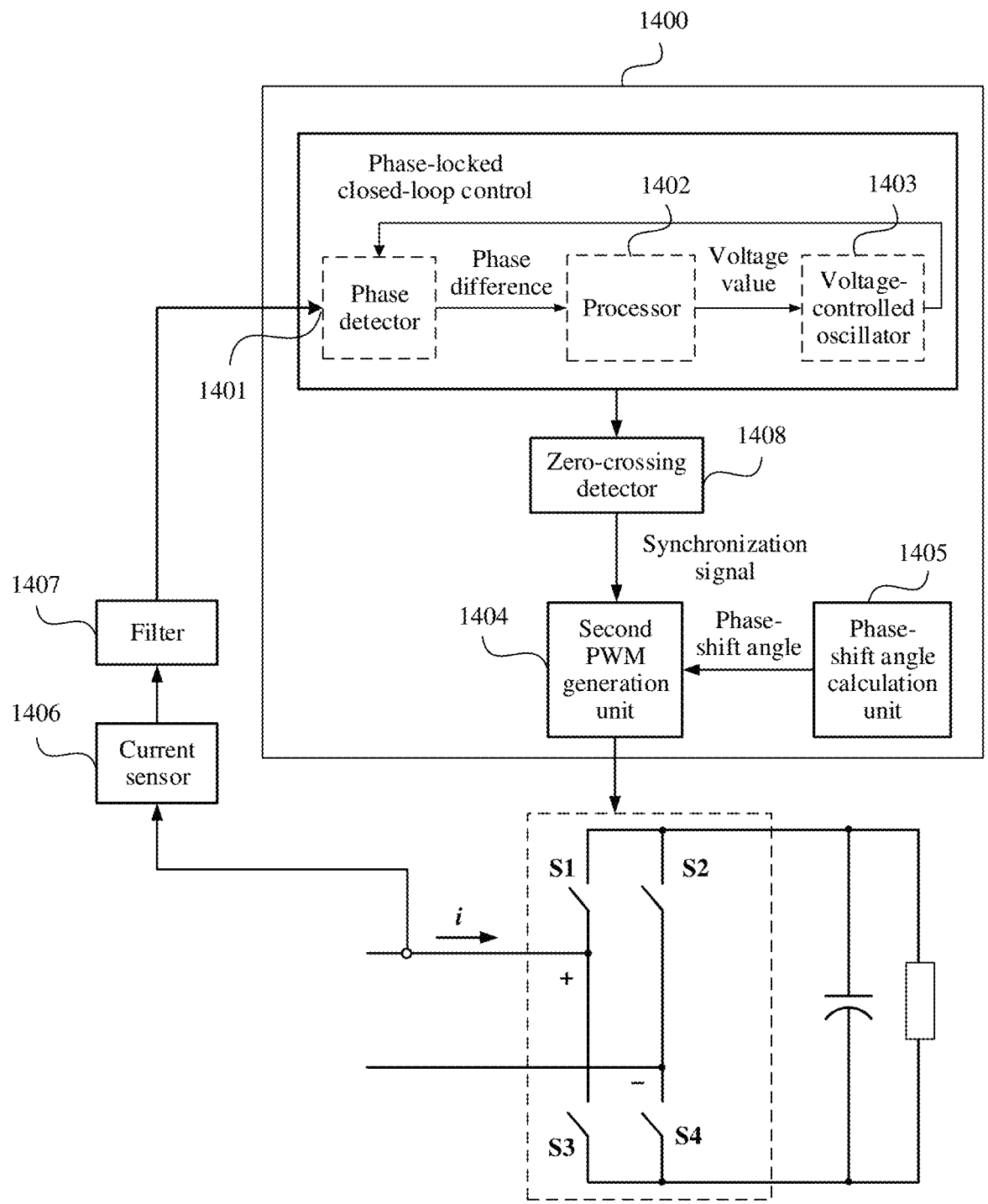
FIG. 14 is a schematic structural diagram of a wireless charging receiving apparatus according to Embodiment 7 of this application.

FIG. 14 is a schematic structural diagram of a wireless charging receiving apparatus according to Embodiment 7 of this application.

The receiving apparatus includes a controller 1400, a current sensor 1406, and a filter 1407.

The controller 1400 specifically includes a phase-locked loop circuit, a zero-crossing detector 1408, a second PWM generation unit 1404, and a phase-shift angle calculation unit 1405.

The phase-locked loop circuit includes a phase detector 1401, a processor 1402, and a voltage-controlled oscillator 1403.

Because the phase-locked loop circuit processes the analog signal, the zero-crossing detector 1408 is located after the voltage-controlled oscillator 1403, while in FIG. 12, the zero-crossing detector is located after the filter.

The zero-crossing detector 1408 is configured to perform zero-crossing detection on the periodic signal, to obtain a periodic signal that is obtained after the zero-crossing detection. The periodic signal is input, as a synchronization signal, to the second PWM generation unit 1404.

In this embodiment, a periodic signal output by the phase-locked loop circuit is an analog sinusoidal signal. Therefore, the zero-crossing detector 1408 is located at an output end of the phase-locked loop circuit, and is configured to perform zero-crossing detection on the sinusoidal signal to obtain a corresponding square wave signal, where the square wave signal is a digital signal.

The phase-locked loop circuit used in this embodiment of this application may process a current fundamental component in a form of an analog signal, and both an input signal and an output signal of the phase-locked loop circuit are analog signals. An analog current signal on which zero-crossing detection processing has not been performed is input to the phase detector 1401, and a periodic signal output by the voltage-controlled oscillator 1403 is an analog sinusoidal signal. The analog sinusoidal signal is input, as a feedback signal, to an input end of the phase detector 1401. Because a subsequent circuit can process only a digital signal, it is required to perform zero-crossing detection on the periodic signal output by the voltage-controlled oscillator to convert the periodic signal into a digital signal. The digital signal serves as the synchronization signal, and the synchronization signal is input, as a reference signal, to the second PWM generation unit 1404. The receiving apparatus provided in this embodiment can lock a phase of an input current of a rectifier, and a synchronization reference signal does not change when load suddenly changes, for example, the load is suddenly increased or decreased, so that a bridge arm voltage of the rectifier is synchronized with the input current of the rectifier, thereby facilitating steady operation of a wireless charging system.

Embodiment 8

In both Embodiment 5, Embodiment 6, and Embodiment 7, filtering and zero-crossing detection are performed on the input current of the rectifier by using hardware other than the controller. In addition, the controller may perform filtering and zero-crossing detection on the input current of the rectifier. This embodiment provides detailed descriptions with reference to the accompanying drawing.

Figure 15:
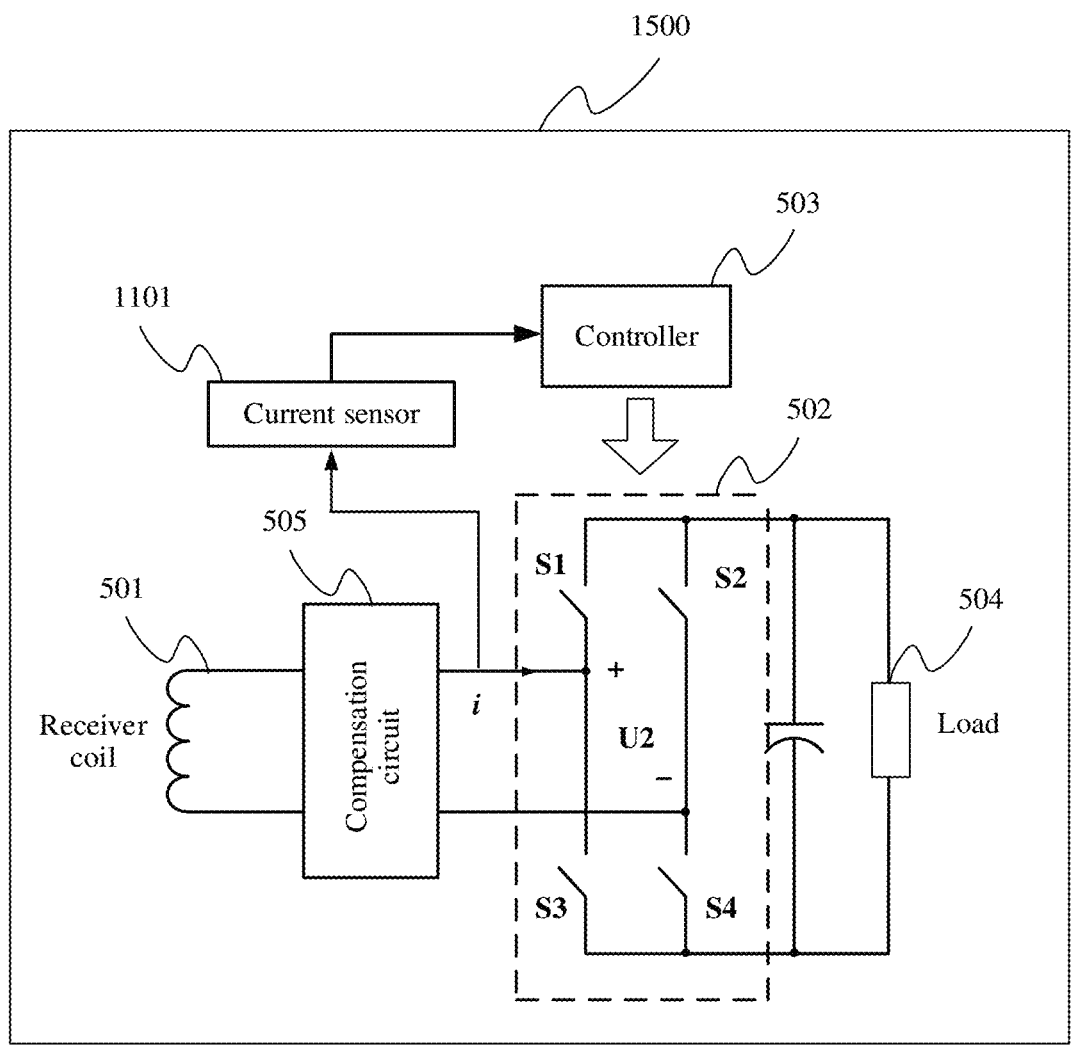
FIG. 15 is a schematic structural diagram of a wireless charging receiving apparatus according to Embodiment 8 of this application.

FIG. 15 is a schematic structural diagram of a wireless charging receiving apparatus according to Embodiment 8 of this application.

The receiving apparatus 1500 provided in this embodiment of this application specifically includes the receiver coil 501, the rectifier 502, the controller 503, and the current sensor 1101.

The current sensor 1101 is the same as the current sensor in the foregoing embodiments. Details are not described herein.

The controller 503 is further configured to filter an input current of the rectifier 502 to obtain a current fundamental component, and perform zero-crossing detection on the current fundamental component to obtain a current fundamental component.

The current fundamental component is directly input to an input end of the controller 503.

In this embodiment of this application, the controller performs filtering and zero-crossing detection on the current fundamental component without using a zero-crossing detector and a filter that are in a hardware form, thereby reducing hardware costs and a hardware size.

In addition, for security in actual work, the receiving apparatus in the foregoing embodiments may further include a wireless communications unit (not shown in the figure).

The wireless communications unit is configured to receive alternating magnetic field period information that is sent by a transmit end.

The controller is further configured to determine whether at least two of the period information, a synchronization reference signal, and a first period value have a same period. If the at least two of the period information, the synchronization reference signal, and the first period value have inconsistent periods, the controller determines that phase-locking fails.

In another embodiment, the receiving apparatus may further include a wireless communications unit (not shown in the figure).

The wireless communications unit is configured to receive alternating magnetic field period information that is sent by a transmit end. The controller is further configured to determine whether a change rate of at least one of the period information, a period reference signal, or a first period value exceeds a preset rate. If the change rate of the at least one of the period information, the synchronization reference signal, or the first period value exceeds the preset rate, the controller determines that phase-locking fails.

In addition, in an embodiment of a phase-locked loop circuit, the receiving apparatus may further include a wireless communications unit.

The wireless communications unit is configured to receive alternating magnetic field period information that is sent by a transmit end.

The controller is further configured to determine whether at least two of the period information, a period reference signal, and a second period value have a same period. If the at least two of the period information, the synchronization reference signal, and the second period value have inconsistent periods, the controller determines that phase-locking fails.

In another embodiment of a phase-locked loop, the receiving apparatus may further include a wireless communications unit.

The wireless communications unit is configured to receive alternating magnetic field period information that is sent by a transmit end.

The controller is further configured to determine whether a change rate of at least one of the period information, a period reference signal, or a second period value exceeds a preset rate. If the change rate of the at least one of the period information, the synchronization reference signal, or the second period value exceeds the preset rate, the controller determines that phase-locking fails.

When it is determined that the phase-locking fails, an entire wireless charging system may be controlled to shut down, to avoid system breakdown or a system fault caused when the entire system enters an uncontrollable working mode.

The rectifier may be any one of the following cases: switches on two bridge arms each are a switch, switches on one of bridge arms each are a switch, switches on upper half bridge arms of two bridge arms each are a switch, and switches on lower half bridge arms of two bridge arms each are a switch. The rectifiers in foregoing embodiments each are described by using an example in which the rectifier is a full-bridge rectifier and includes four controllable switches. The following describes other implementations with reference to the accompanying drawings.

Embodiment 9

In this embodiment of this application, switches on one bridge arm of a rectifier are uncontrollable diodes, and switches on the other bridge arm are controllable switches. The following provides detailed descriptions with reference to the accompanying drawings.

Figure 16:
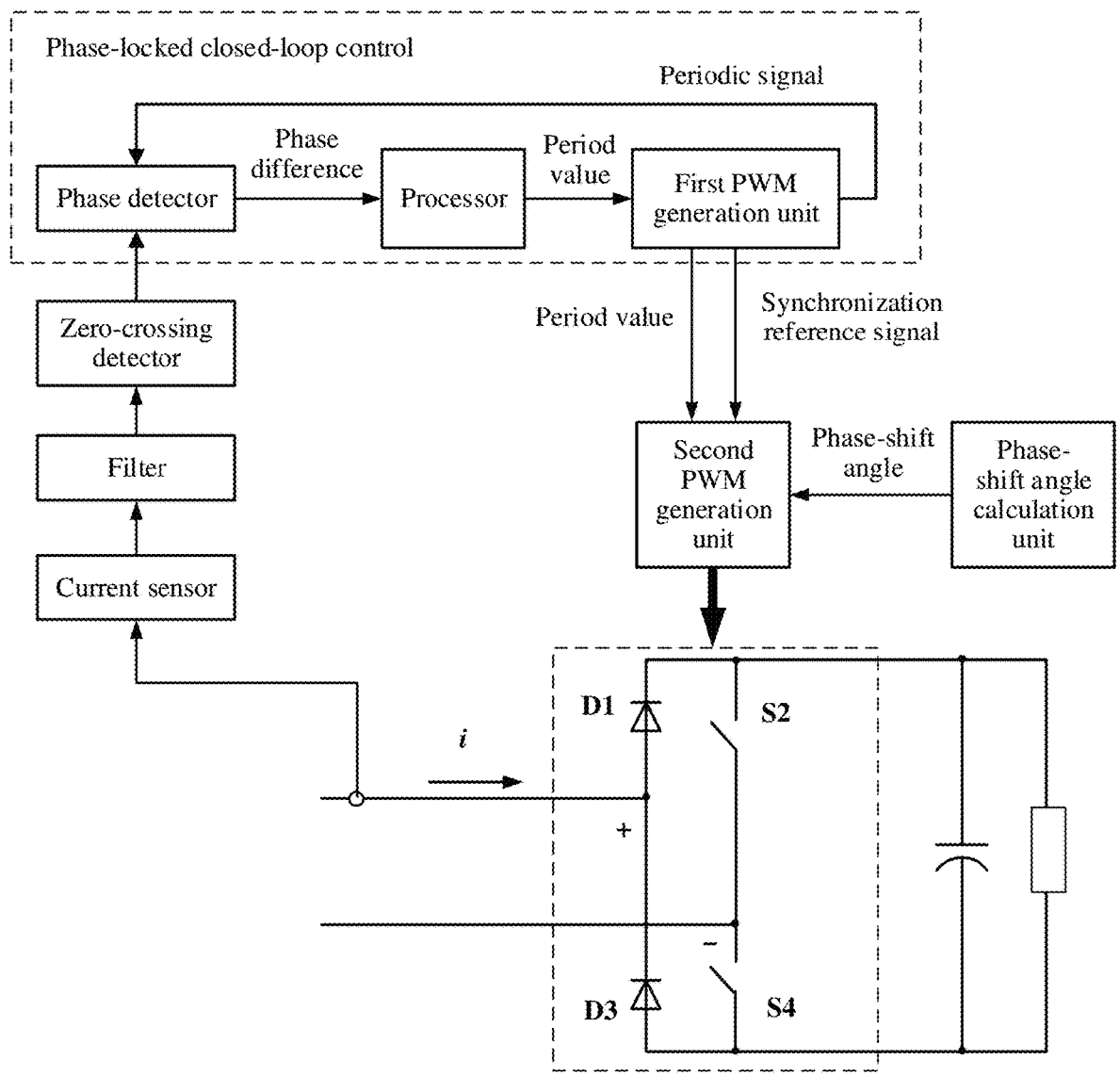
FIG. 16 is a schematic structural diagram of a wireless charging receiving apparatus according to Embodiment 9 of this application.

FIG. 16 is a schematic structural diagram of a wireless charging receiving apparatus according to Embodiment 9 of this application.

A difference between this embodiment of this application and Embodiment 5 lies only in that the controllable switches S1 and S3 on the left bridge arm of the rectifier are replaced with uncontrollable diodes D1 and D2. It should be noted that, if the controllable switches S2 and S4 on the right bridge arm of the rectifier are replaced with uncontrollable diodes, an effect is the same as an effect of replacing the controllable switches S1 and S3 on the left bridge arm of the rectifier.

How the receiving apparatus provided in this embodiment works is similar to that in the foregoing embodiments. Details are not described herein.

Embodiment 10

In this embodiment of this application, switches on one bridge arm of a rectifier are uncontrollable diodes, switches on the other bridge arm are controllable switches, and a controller includes a digital phase-locked loop circuit. The following provides detailed descriptions with reference to the accompanying drawings.

Figure 17:
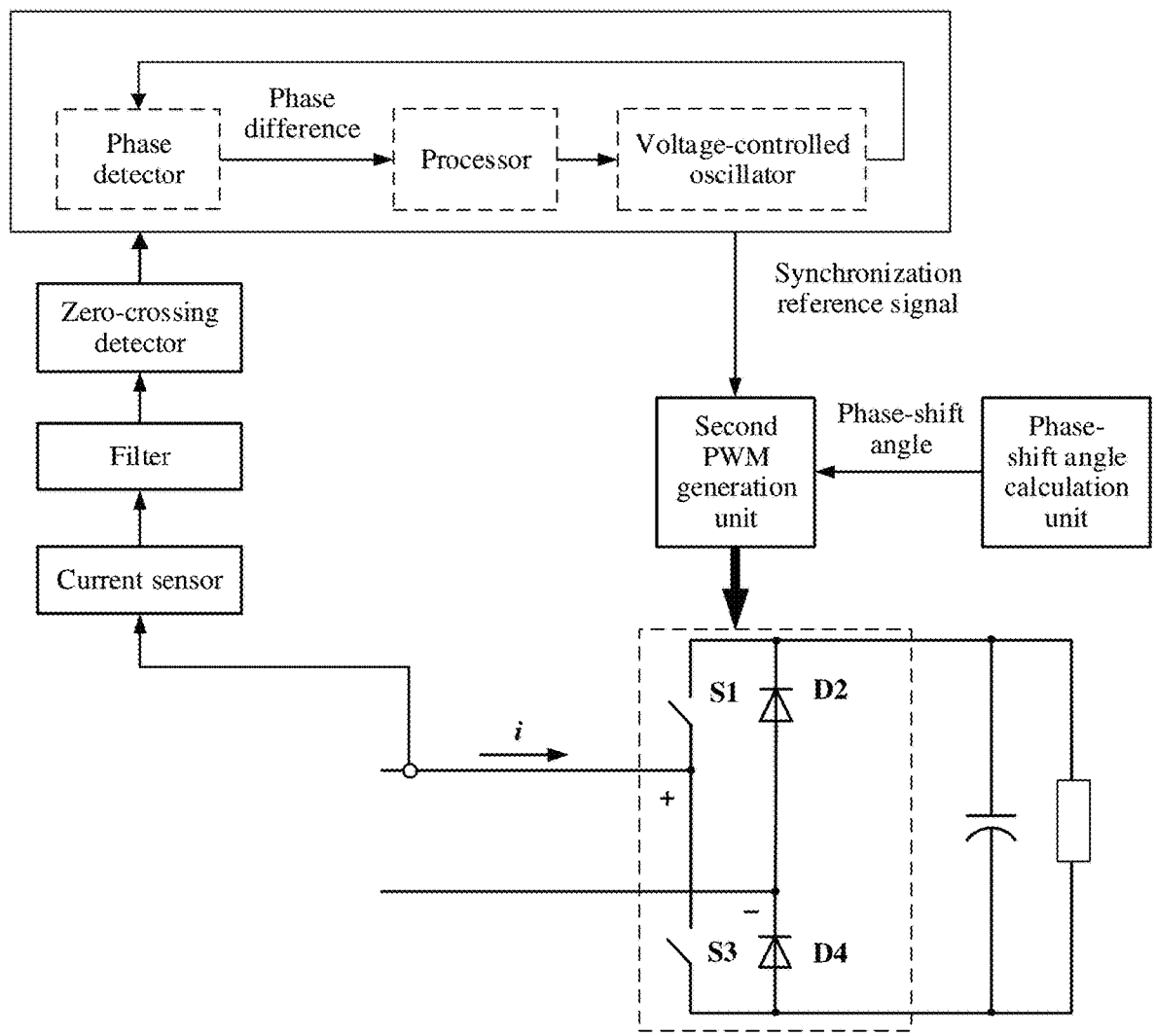
FIG. 17 is a schematic structural diagram of a wireless charging receiving apparatus according to Embodiment 10 of this application.

FIG. 17 is a schematic structural diagram of a wireless charging receiving apparatus according to Embodiment 10 of this application.

A difference between this embodiment of this application and Embodiment 6 lies only in that the controllable switches S2 and S4 on the right bridge arm of the rectifier are replaced with uncontrollable diodes D2 and D4. It should be noted that, if the controllable switches S1 and S3 on the left bridge arm of the rectifier are replaced with uncontrollable diodes, an effect is the same as an effect of replacing the controllable switches S2 and S4 on the right bridge arm of the rectifier.

Embodiment 11

In this embodiment of this application, switches on one bridge arm of a rectifier are uncontrollable diodes, switches on the other bridge arm are controllable switches, and a controller includes an analog phase-locked loop circuit. The following provides detailed descriptions with reference to the accompanying drawings.

Figure 18:
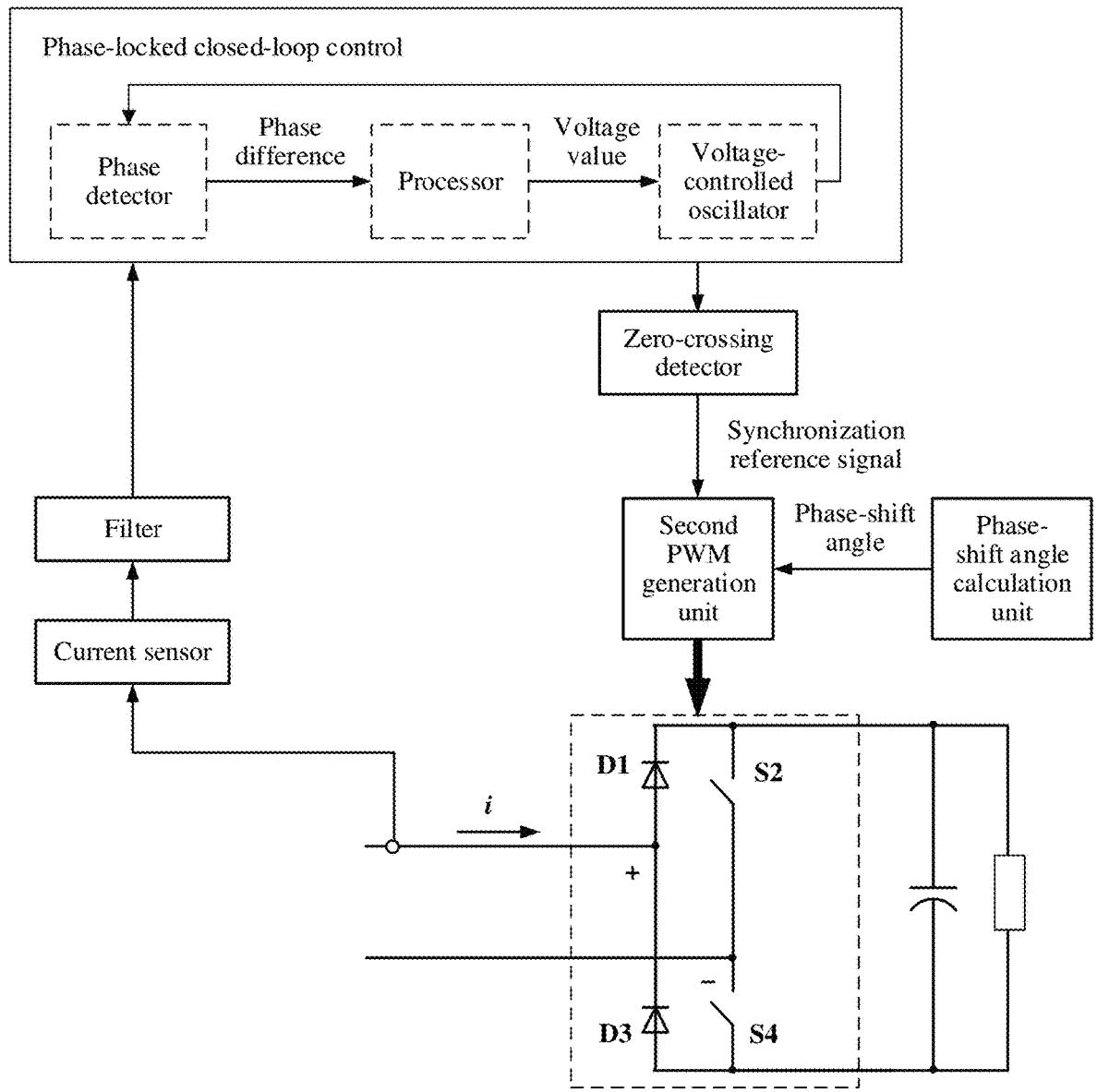
FIG. 18 is a schematic structural diagram of a wireless charging receiving apparatus according to Embodiment 11 of this application.

FIG. 18 is a schematic structural diagram of a wireless charging receiving apparatus according to Embodiment 11 of this application.

A difference between this embodiment of this application and Embodiment 7 lies only in that the controllable switches S1 and S3 on the left bridge arm of the rectifier are replaced with uncontrollable diodes D1 and D2. It should be noted that, if the controllable switches S2 and S4 on the right bridge arm of the rectifier are replaced with uncontrollable diodes, an effect is the same as an effect of replacing the controllable switches S1 and S3 on the left bridge arm of the rectifier.

Embodiment 12

In this embodiment of this application, two lower transistors or two upper transistors in a rectifier are uncontrollable diodes, and the other two switches are controllable switches. The following provides detailed descriptions with reference to the accompanying drawings.

Figure 19:
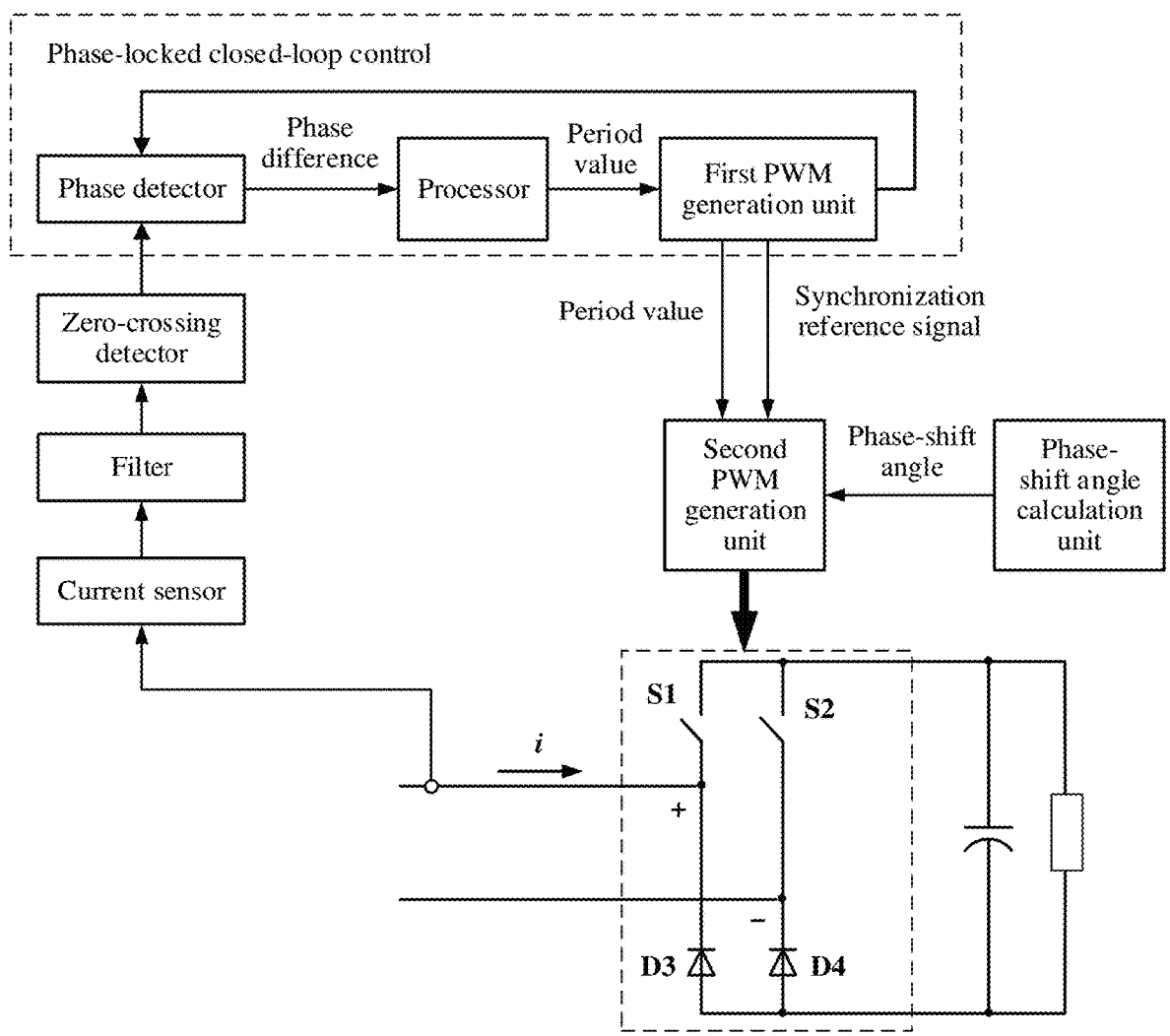
FIG. 19 is a schematic structural diagram of a wireless charging receiving apparatus according to Embodiment 12 of this application.

FIG. 19 is a schematic structural diagram of a wireless charging receiving apparatus according to Embodiment 12 of this application.

A difference between this embodiment of this application and Embodiment 5 lies only in that the two lower transistors S3 and S4 in the rectifier are replaced with uncontrollable diodes D3 and D4. It should be noted that, if the two upper transistors S1 and S2 in the rectifier are replaced with uncontrollable diodes, an effect is the same as an effect of replacing the two lower transistors in the rectifier.

Embodiment 13

In this embodiment of this application, two lower transistors or two upper transistors in a rectifier are uncontrollable diodes, the rest switches are controllable switches, and a controller includes a digital phase-locked loop circuit. The following provides detailed descriptions with reference to the accompanying drawings.

Figure 20:
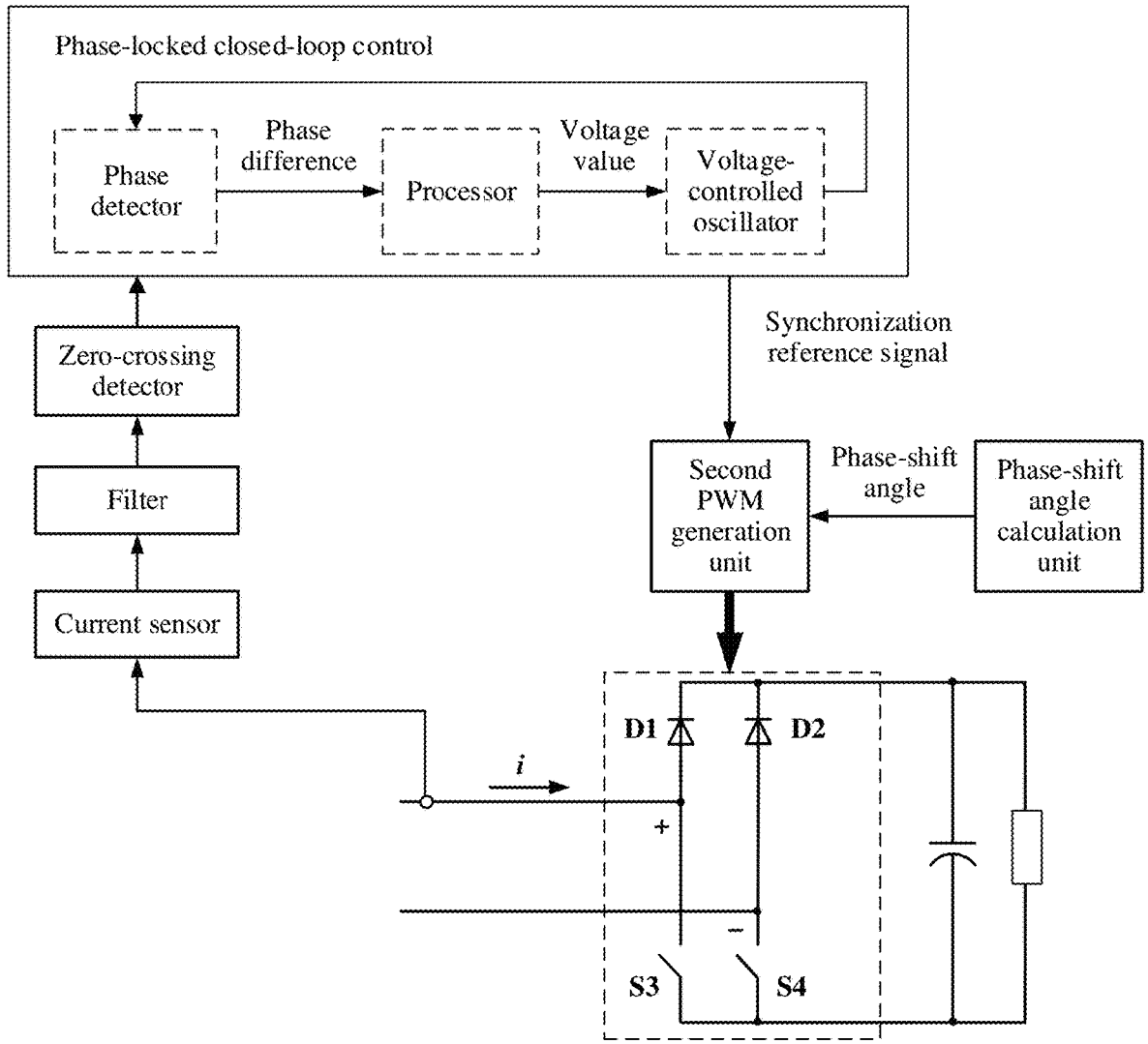
FIG. 20 is a schematic structural diagram of a wireless charging receiving apparatus according to Embodiment 13 of this application.

FIG. 20 is a schematic structural diagram of a wireless charging receiving apparatus according to Embodiment 13 of this application.

A difference between this embodiment of this application and Embodiment 6 lies only in that the two upper transistors S1 and S2 in the rectifier are replaced with uncontrollable diodes D1 and D2. It should be noted that, if the two lower transistors S3 and S4 in the rectifier are replaced with uncontrollable diodes, an effect is the same as an effect of replacing the two upper transistors in the rectifier.

Embodiment 14

In this embodiment of this application, two lower transistors or two upper transistors in a rectifier are uncontrollable switches, the other two switches are controllable, and a controller includes an analog phase-locked loop circuit. The following provides detailed descriptions with reference to the accompanying drawings.

Figure 21:
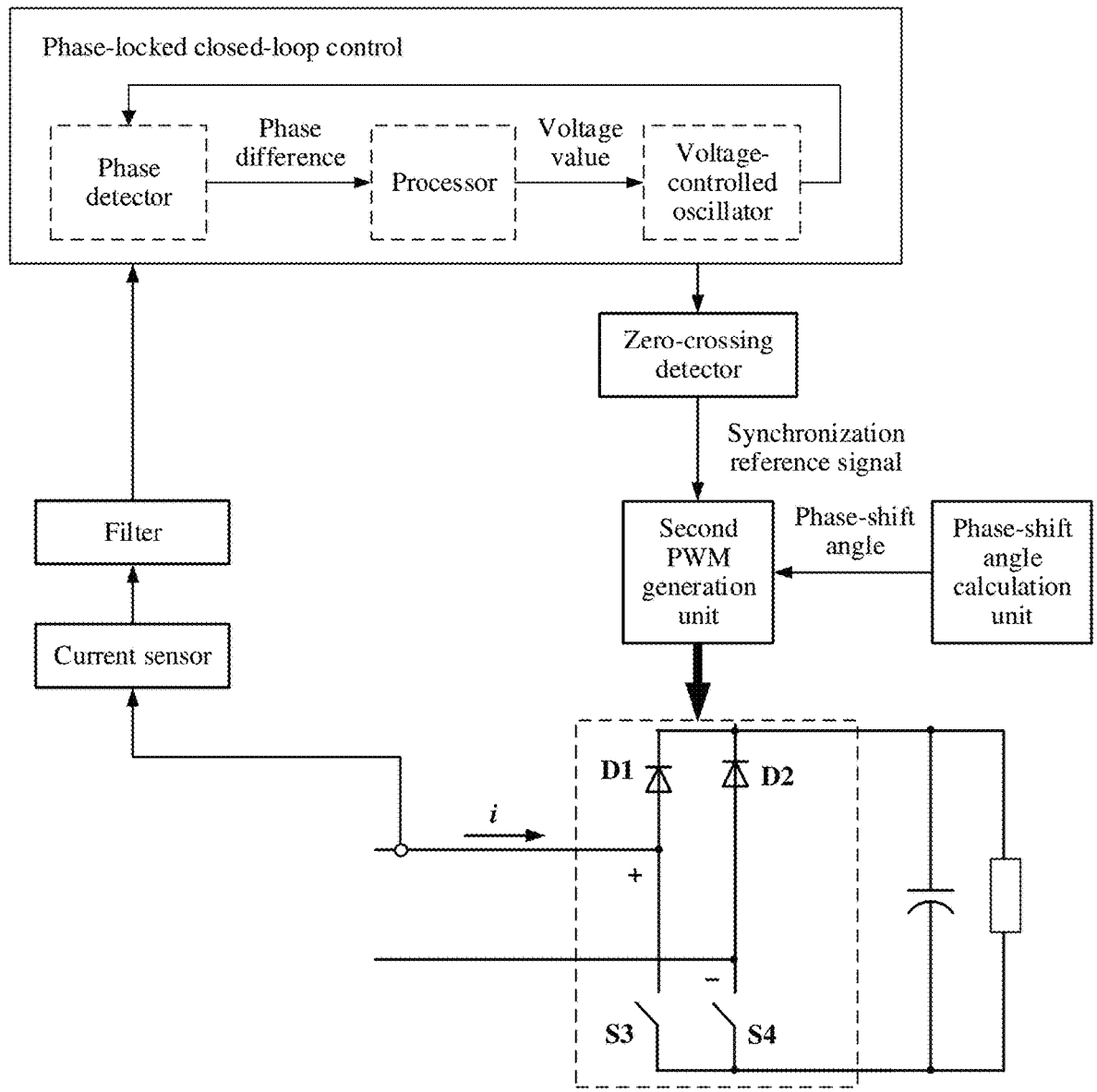
FIG. 21 is a schematic structural diagram of a wireless charging receiving apparatus according to Embodiment 14 of this application.

FIG. 21 is a schematic structural diagram of a wireless charging receiving apparatus according to Embodiment 14 of this application.

A difference between this embodiment of this application and Embodiment 7 lies only in that the two upper transistors S1 and S2 in the rectifier are replaced with uncontrollable diodes D1 and D2. It should be noted that, if the two lower transistors S3 and S4 in the rectifier are replaced with uncontrollable diodes, an effect is the same as an effect of replacing the two upper transistors in the rectifier.

Embodiment 15

In the wireless charging receiving apparatus provided in the foregoing embodiments of this application, the rectifiers each are in a full-bridge structure. This embodiment of this application further provides a wireless charging receiving apparatus, and a rectifier of the wireless charging receiving apparatus is in a half-bridge structure. The following provides descriptions with reference to the accompanying drawings.

Figure 22:
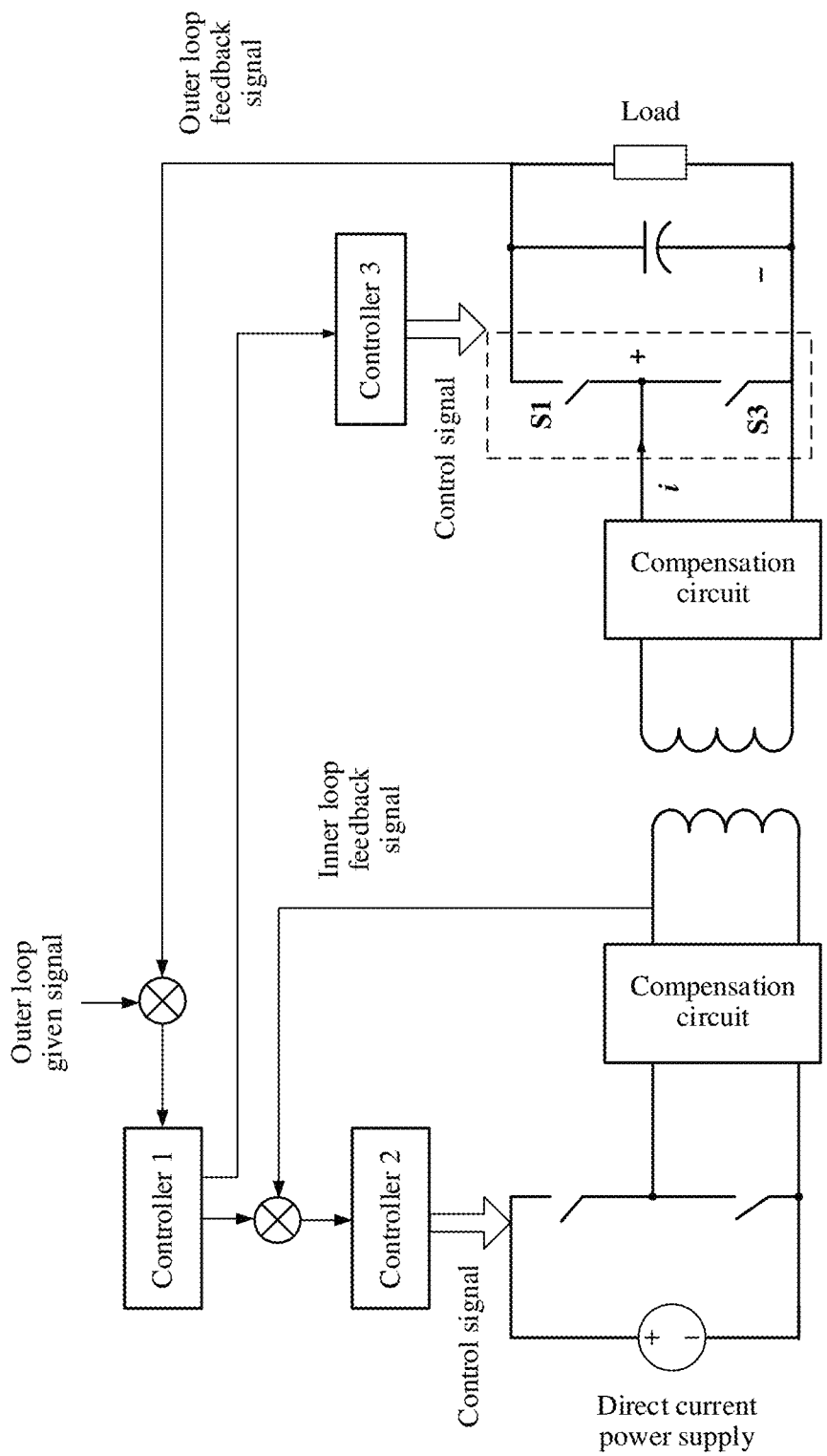
FIG. 22 is a schematic structural diagram of a wireless charging system that uses active tuning and that uses a half-bridge structure for each of rectification and inversion according to Embodiment 15 of this application.

FIG. 22 is a schematic structural diagram of a wireless charging system that uses active tuning and in which a rectifier in a half-bridge structure according to Embodiment 15 of this application.

Figure 23:
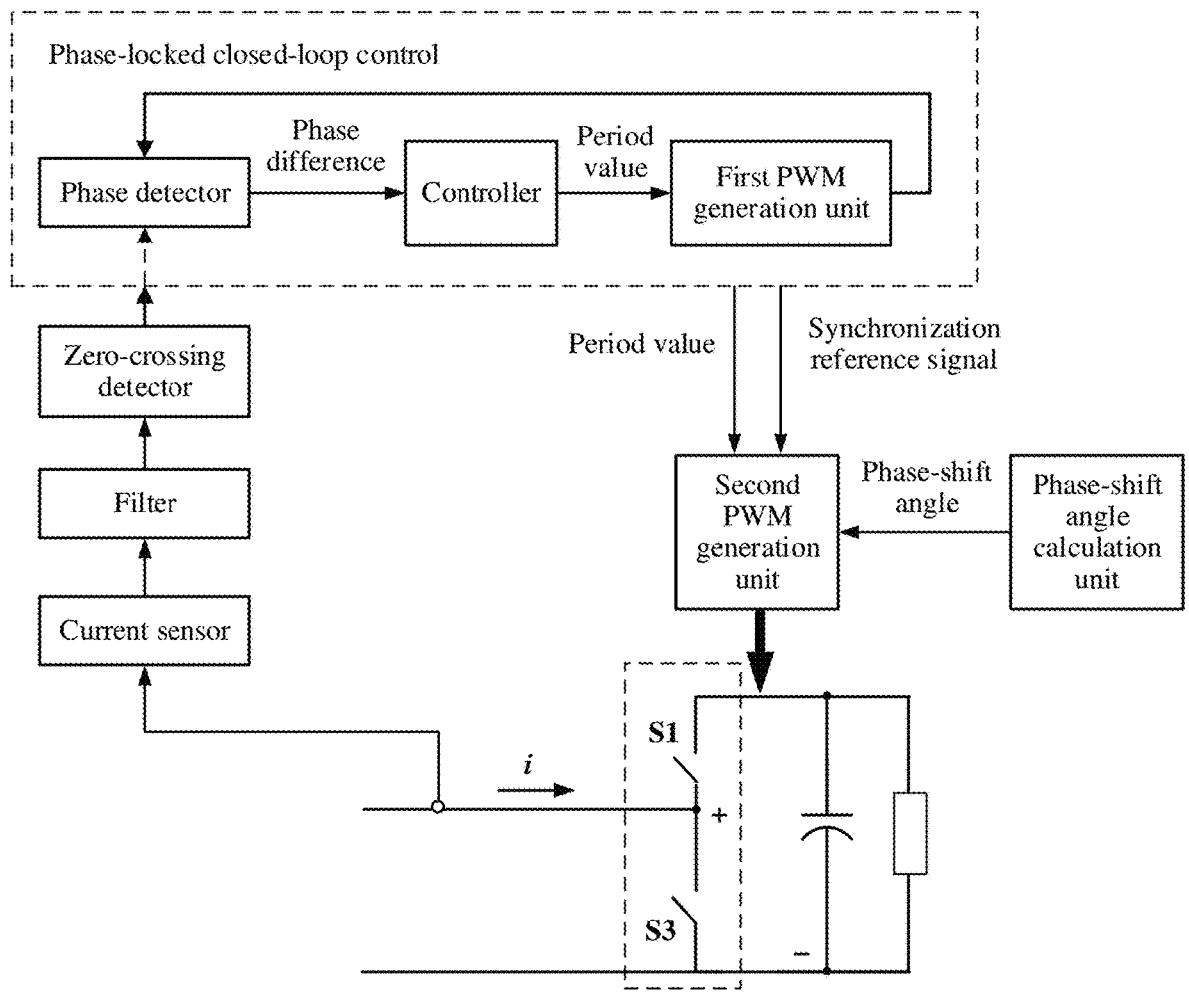
FIG. 23 is a schematic structural diagram of a wireless charging receiving apparatus according to Embodiment 15 of this application.

FIG. 23 is a schematic structural diagram of a wireless charging receiving apparatus according to Embodiment 15 of this application.

The three control manners used in Embodiment 5 to Embodiment 7 are all applicable to the half-bridge structure in Embodiment 15. A difference is that instead of drive signals of two bridge arms, drive signals of only one bridge arm need to be synchronized in a second PWM generation unit.

In this embodiment of this application, that a controller generates drive signals of controllable switches in a rectifier based on a synchronization reference signal is that the controller generates drive signals of controllable switches in the half-bridge rectifier based on the synchronization reference signal, a phase-shift angle of a bridge arm of the half-bridge rectifier and a second preset comparison value.

Embodiment 16

Based on the wireless charging receiving apparatus provided in the foregoing embodiments, this embodiment of this application further provides a wireless charging receiving apparatus. The following provides descriptions with reference to the accompanying drawings.

Figure 24:
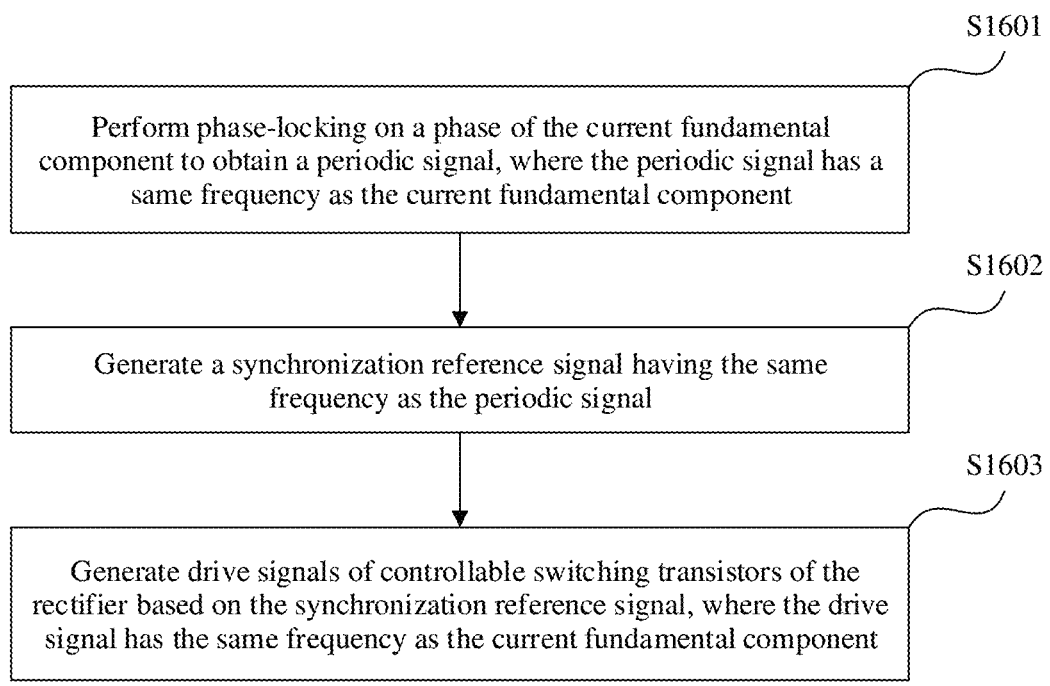
FIG. 24 is a flowchart of a wireless charging control method according to Embodiment 16 of this application.

FIG. 24 is a flowchart of a wireless charging control method according to Embodiment 16 of this application.

The method provided in this embodiment is applied to a wireless charging receiving apparatus.

The method described in this embodiment of this application includes the following steps.

S1601. Receive electromagnetic energy transmitted by a transmitter coil and output an alternating current, and perform phase-locking on a phase of a current fundamental component of the alternating current, to obtain a periodic signal having a same frequency as the current fundamental component.

Specifically, that the performing phase-locking on a phase of a current fundamental component to obtain a periodic signal specifically includes obtaining a phase difference between the current fundamental component and an initial preset periodic signal that are of the first round of phase-locking, performing low-pass filtering on the phase difference, performing proportional-integral control on a phase difference obtained after the filtering to obtain a first period value, and obtaining, based on the first period value, a periodic signal corresponding to the first round of phase-locking, where the first period value is inversely proportional to the phase difference, and in a non-first round of phase-locking, comparing a periodic signal of a previous period that is obtained after phase-locking with a current fundamental component of the present period, to obtain a periodic signal of the present period.

It should be noted that, when a phase-locked loop circuit in the controller is used to perform phase-locking, the performing phase-locking on a phase of a current fundamental component to obtain a periodic signal specifically includes the phase detector is configured to obtain the phase difference between the current fundamental component and the initial preset periodic signal that are of the first round of phase-locking, the processor is configured to perform the low-pass filtering on the phase difference of the first round of phase-locking and obtain the voltage value of the first round of phase-locking based on the phase difference obtained after the low-pass filtering, the voltage-controlled oscillator is configured to obtain the periodic signal of the first round of phase-locking based on the voltage value of the first round of phase-locking, and the phase detector is configured to in a non-first round of phase-locking, obtain a phase difference between the periodic signal of the previous period that is obtained after the phase-locking and the current fundamental component of the present period, the processor is configured to obtain a voltage value of the present period based on the phase difference of the present period, and the voltage-controlled oscillator is configured to obtain the periodic signal of the present period based on the voltage value of the present period.

S1602. Generate a synchronization reference signal having the same frequency as the periodic signal.

The controller is configured to obtain the synchronization reference signal based on the first period value and a first preset comparison value, where the first preset comparison value is used to adjust a phase difference between the periodic signal and the synchronization reference signal.

S1603. Generate drive signals of controllable switches in the rectifier based on the synchronization reference signal, and control, based on the drive signals, the controllable switches in the rectifier to convert the alternating current into a direct current, where the drive signals and the current fundamental component have the same frequency.

An input current of the rectifier includes a harmonic, and that a bridge arm voltage of the rectifier is controlled to be synchronized with the input current of the rectifier means that a period of the bridge arm voltage of the rectifier is controlled to be synchronized with a period of the current fundamental component. Therefore, a reference object is a phase of the current fundamental component, and the periodic signal is obtained by performing phase-locking on the phase.

Because a hardware circuit that samples the input current causes phase lag, the current fundamental component is a signal having a phase difference with an actual input current. This phase difference depends on a structure and a parameter of the hardware circuit that performs sampling.

The periodic signal may be a square wave or a sine wave. This is not specifically limited in this embodiment of this application.

The synchronization reference signal and the periodic signal have the same frequency, namely, a same period. In addition, the synchronization reference signal and the periodic signal may have a same phase, or there may be a fixed phase difference between the synchronization reference signal and the periodic signal.

The drive signals of the controllable switches in the rectifier 102 are generated based on the synchronization reference signal, and the drive signals are pulse-width modulation (PWM) signals. Referring to the controllable switches shown in FIG. 5, the drive signals in this embodiment of this application may specifically include a first PWM drive signal and a second PWM drive signal, where the first PWM drive signal may be used to drive the controllable switches S1 and S3, and the second PWM drive signal may be used to drive the controllable switches S2 and S4. The first PWM drive signal and the second PWM drive signal each have the same period as the periodic signal, and there is an adjustable phase-shift angle θ between the first PWM drive signal and the second PWM drive signal. The phase-shift angle θ, namely, a phase-shift angle between a front bridge arm and a rear bridge arm of the rectifier may be adjusted to implement a phase shift function of the drive signals.

For phase-locking control, the periodic signal serves as a feedback signal, and the current fundamental component serves as a reference signal. Subtraction is performed between a phase of the periodic signal and the phase of the current fundamental component. The periodic signal is controlled based on the phase difference, so that the periodic signal follows the current fundamental component. To be specific, the phase of the periodic signal follows the phase of the current fundamental component, and a period of the periodic signal is synchronized with the period of the current fundamental component.

In the receiving apparatus provided in this embodiment of this application, the controller performs phase-locking on a phase of the input current of the rectifier and locks the phase of the input current in a closed loop control manner. When a wireless charging system works in a steady state, an input signal and a feedback signal that are of phase-locked closed loop control have a same phase by mainly using an inertia stage of the phase-locking control. When load jumps, the phase or a period of the input current of the rectifier may change. However, because of the inertia stage of the phase-locking control, in a time of oscillation, an output signal of the phase-locked closed loop control can still maintain a phase and a period the same as those in the steady state, thereby ensuring stable performance in a transient state. Therefore, it can be ensured that the synchronization reference signal and the fundamental component of the input current have the same period, namely, the same frequency. The drive signals of the controllable switches are generated by using the synchronization reference signal, so that the bridge arm voltage and the input current can have a same frequency. Consequently, after the phase-locking, a period of the synchronization reference signal does not change due to a sudden change of the load, and frequencies of the drive signals do not jump. In this embodiment of this application, it can be ensured that the input current of the rectifier is synchronized with the bridge arm voltage of the rectifier, in other words, the input current and the bridge arm voltage have the same frequency, so that the entire wireless charging system works in the steady state.

Embodiment 17

Based on the wireless charging receiving apparatus provided in the foregoing embodiments of this application, this embodiment of this application further provides a wireless charging system. The following provides descriptions with reference to the accompanying drawings.

Figure 25:
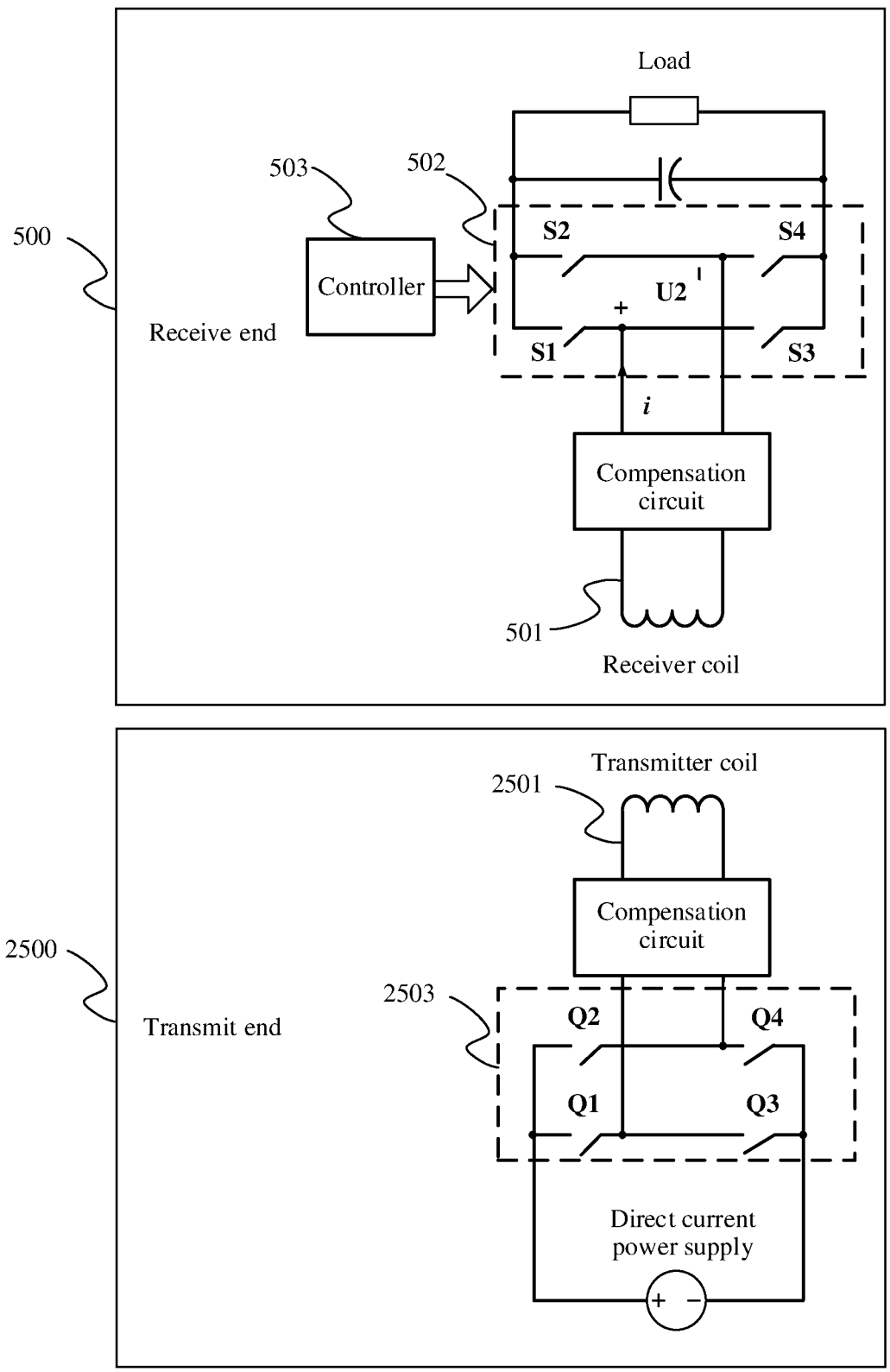
FIG. 25 is a schematic structural diagram of a wireless charging system according to Embodiment 17 of this application.

FIG. 25 is a schematic structural diagram of a wireless charging system according to Embodiment 17 of this application.

The wireless charging system provided in this embodiment of this application includes a transmitting apparatus 2500 and the receiving apparatus 500 described in the foregoing embodiments. The receiving apparatus 500 includes the receiver coil 501, the rectifier 502, and the controller 503.

The transmitting apparatus includes an inverter 2501 and a transmitter coil 2502.

The inverter 2501 is configured to invert a direct current from a direct current power supply to an alternating current. The inverter 2501 and the rectifier 502 may be in a same structure. For example, the inverter 2501 and the rectifier 502 each are full-bridge and include two bridge arms, and switches on the two bridge arms each are a switch.

The transmitter coil 2502 is configured to transmit the electromagnetic energy to the receiving apparatus.

Because of a hardware circuit that samples the input current of the rectifier 502, a phase of the input current that is sampled lags behind a phase of an actual input current. A difference by which the phase of the input current that is sampled lags behind the phase of the actual input current depends on a specific structure and a specific parameter of the hardware circuit that performs sampling.

The periodic signal may be a periodic signal in a square wave form or a sine wave form. This is not specifically limited in this embodiment of this application. There is a fixed phase difference between the periodic signal and the current fundamental component, and the fixed phase difference may be 0 or another value.

A synchronization reference signal and the periodic signal have a same frequency, namely, a same period. In addition, there may be a fixed phase difference between the synchronization reference signal and the periodic signal, and the fixed phase difference may be 0 or another value.

Drive signals of controllable switches in the rectifier 102 are generated based on the synchronization reference signal, and the drive signals are pulse-width modulation (PWM) signals. Referring to the controllable switches shown in FIG. 5, the drive signals in this embodiment of this application may specifically include a first PWM drive signal and a second PWM drive signal. The first PWM drive signal may be used to drive the controllable switches S1 and S3, and the second PWM drive signal may be used to drive the controllable switches S2 and S4. The first PWM drive signal and the second PWM drive signal each have the same period as the periodic signal, and there is an adjustable phase-shift angle θ between the first PWM drive signal and the second PWM drive signal. The phase-shift angle θ, namely, a phase-shift angle between a front bridge arm and a rear bridge arm of the rectifier may be adjusted to implement a phase shift function of the drive signals.

For phase-locking control, the periodic signal serves as a feedback signal, and the current fundamental component serves as a reference signal. Subtraction is performed between a phase of the periodic signal and a phase of the current fundamental component. The periodic signal is controlled based on the phase difference, so that the periodic signal follows the current fundamental component. To be specific, the phase of the periodic signal follows the phase of the current fundamental component, and a period of the periodic signal is synchronized with a period of the current fundamental component.

In the wireless charging system provided in this embodiment of this application, the controller performs phase-locking on the phase of the input current of the rectifier and locks the phase of the input current in a closed loop control manner. When the wireless charging system works in a steady state, an input signal and a feedback signal that are of phase-locked closed loop control have a same phase by mainly using an inertia stage of the phase-locking control. When load jumps, the phase or a period of the input current of the rectifier may change. However, because of the inertia stage of the phase-locking control, in a time of an oscillation transient state caused by a sudden change of the load, an output signal of the phase-locked closed loop control can still maintain a phase and a period the same as those in the steady state, thereby ensuring stable performance in the transient state. Therefore, it can be ensured that the synchronization reference signal and the current fundamental component have the same period, namely, the same frequency. The drive signals of the controllable switches are generated by using the synchronization reference signal, so that the current fundamental component and the bridge arm voltage of the rectifier can have the same frequency. Consequently, after the phase-locking, a period of the synchronization reference signal does not change due to the sudden change of the load, and frequencies of the drive signals do not jump. In this embodiment of this application, it can be ensured that the input current of the rectifier is synchronized with the bridge arm voltage of the rectifier, so that the entire wireless charging system works in the steady state.

It should be understood that, in this application, "at least one" means one or more, and "a plurality of" means two or more. The term "and/or" is used to describe an association relationship between associated objects, and indicates that three relationships may exist. For example, "A and/or B"

may indicate the following three cases: Only A exists, only B exists, and both A and B exist, where A and B may be singular or plural. The character "/" generally indicates an "or" relationship between the associated objects. "At least one of the following" or a similar expression thereof indicates any combination of the following, including any combination of one or more of the following. For example, at least one of a, b, or c may indicate a, b, c, "a and b", "a and c", "b and c", or "a, b, and c", where a, b, and c may be singular or plural.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A wireless charging receiving apparatus, comprising:
   a receiver coil;
   a rectifier; and
   a controller;
   wherein the receiver coil is configured to receive electromagnetic energy transmitted by a transmitter coil and to output an alternating current;
   wherein the rectifier comprises at least two controllable switches, and is configured to rectify the alternating current from the receiver coil to a direct current by using the at least two controllable switches;
   wherein the controller is configured to perform phase-locking on a phase of a current fundamental component of the alternating current received by the rectifier according to a phase difference between the current fundamental component and an initial preset periodic signal that are of a first round of phase-locking, and wherein the controller is configured to obtain a periodic signal having a same frequency as the current fundamental component as a result of the phase locking; and
   wherein the controller is further configured to:
      generate a synchronization reference signal having the same frequency as the periodic signal;
      generate drive signals of the at least two controllable switches of the rectifier based on the synchronization reference signal; and
      control, based on the drive signals, the at least two controllable switches of the rectifier to cause the rectifier to convert the alternating current into the direct current, wherein the drive signals and the current fundamental component have the same frequency.

2. The receiving apparatus according to claim 1, wherein the controller being configured to perform the phase-locking comprises the controller being configured to:
   obtain the phase difference between the current fundamental component and the initial preset periodic signal that are of the first round of phase-locking;
   perform low-pass filtering on the phase difference;
   perform proportional-integral control on a phase difference obtained after the filtering to obtain a first period value;
   obtain, based on the first period value, a periodic signal corresponding to the first round of phase-locking, wherein the first period value is inversely proportional to the phase difference; and
   obtain a periodic signal of a present period by comparing, outside of the first round of phase locking, a periodic signal of a previous period that is obtained after phase-locking with a current fundamental component of the present period.

3. The receiving apparatus according to claim 2, wherein the controller being configured to generate the synchronization reference signal comprises the controller being configured to:
   obtain the synchronization reference signal based on the first period value and a first preset comparison value, wherein the first preset comparison value is associated with a phase difference between the periodic signal and the synchronization reference signal.

4. The receiving apparatus according to claim 3, wherein the controller being configured to obtain the synchronization reference signal based on the first period value and a first preset comparison value comprises the controller being configured to implement a counter that counts from 0 to the first period value in each period to form a counting sequence, and that obtains a triangle wave based on the counting sequence; and
   wherein the controller is further configured to compare an instantaneous value of the triangle wave with the first preset comparison value, wherein a first part that is of the triangle wave and that has an instantaneous value greater than the first preset comparison value forms a high level of the synchronization reference signal, and wherein a second part that is of the triangle wave and that has an instantaneous value less than the first preset comparison value forms a low level of the synchronization reference signal.

5. The receiving apparatus according to claim 2, wherein the controller being configured to generate the drive signals of the at least two controllable switches in the rectifier based on the synchronization reference signal comprises the controller being configured to generate the drive signals of the at least two controllable switches in the rectifier based on the synchronization reference signal and a second preset comparison value, wherein the second preset comparison value is half of the first period value.

6. The receiving apparatus according to claim 2, wherein the rectifier is a full-bridge rectifier and comprises two bridge arms; and
   wherein the controller being configured to generate the drive signals of the at least two controllable switches in the rectifier based on the synchronization reference signal specifically comprises the controller being configured to generate a first drive signal of controllable switches on a front bridge arm of the full-bridge rectifier and a second drive signal of controllable switches on a rear bridge arm of the full-bridge rectifier based on the synchronization reference signal, a phase-shift angle between the two bridge arms of the full-bridge rectifier, and a second preset comparison value, wherein a phase difference between the first drive signal and the second drive signal is the phase-shift angle, and wherein the second preset comparison value is half of the first period value.

7. The receiving apparatus according to claim 2, further comprising a wireless communications unit, wherein the wireless communications unit is configured to receive current period information of the transmitter coil sent by a transmitting apparatus; and
   wherein the controller is further configured to control the receiving apparatus to stop working in response to any two of the current period information of the transmitter coil, the synchronization reference signal, or the first period value having inconsistent periods.

8. The receiving apparatus according to claim 2, further comprising a wireless communications unit, wherein the wireless communications unit is configured to receive current period information of the transmitter coil sent by a transmitting apparatus; and wherein the controller is further configured to control the receiving apparatus to stop working in response to a change rate of at least one of the current period information of the transmitter coil, a period reference signal, or the first period value exceeding a preset rate.

9. The receiving apparatus according to claim 2, wherein a phase difference between the periodic signal and the current fundamental component is fixed in each period.

10. The receiving apparatus according to claim 1, wherein the controller comprises:
a phase detector;
a processor; and
a voltage-controlled oscillator;
wherein the phase detector is configured to obtain the phase difference between the current fundamental component of the first round of phase-locking and the initial preset periodic signal of the first round of phase-locking;
wherein the processor is configured to perform low-pass filtering on the phase difference of the first round of phase-locking and obtain a voltage value of the first round of phase-locking based on a phase difference obtained after the low-pass filtering;
wherein the voltage-controlled oscillator is configured to obtain a periodic signal of the first round of phase-locking based on the voltage value of the first round of phase-locking;
wherein the phase detector is configured to obtain, in a non-first round of phase-locking, a phase difference between a periodic signal of a previous period that is obtained after phase-locking and a current fundamental component of a present period;
wherein the processor is configured to obtain a voltage value of the present period based on the phase difference of the present period; and
wherein the voltage-controlled oscillator is configured to obtain a periodic signal of the present period based on the voltage value of the present period.

11. The receiving apparatus according to claim 10, wherein the synchronization reference signal and the periodic signal have a same phase.

12. The receiving apparatus according to claim 10, wherein the controller being configured to generate drive signals of the at least two controllable switches in the rectifier based on the synchronization reference signal comprises the controller being configured to:
obtain a digital voltage value by performing analog-to-digital conversion on the voltage value;
obtain a second period value based on the digital voltage value; and
generate the drive signals of the at least two controllable switches in the rectifier based on the synchronization reference signal and a third preset comparison value, wherein the third preset comparison value is half of the second period value.

13. The receiving apparatus according to claim 12, further comprising a wireless communications unit, wherein the wireless communications unit is configured to receive alternating magnetic field period information of the receiver coil sent by a transmitting apparatus; and wherein the controller is further configured to control the receiving apparatus to stop working in response to any two of the alternating magnetic field period information of the receiver coil, the synchronization reference signal, or the second period value having inconsistent periods.

14. The receiving apparatus according to claim 12, further comprising a wireless communications unit, wherein the wireless communications unit is configured to receive alternating magnetic field period information of the receiver coil sent by a transmitting apparatus; and wherein the controller is further configured to control the receiving apparatus to stop working in response to a change rate of at least one of the alternating magnetic field period information of the receiver coil, the synchronization reference signal, or the second period value exceeding a preset rate.

15. The receiving apparatus according to claim 1, wherein the phase difference between the periodic signal and the current fundamental component is fixed in each period.

16. The receiving apparatus according to claim 1, further comprising a compensation circuit, wherein the compensation circuit connects the receiver coil and the rectifier; and wherein the compensation circuit is configured to compensate the alternating current output by the receiver coil and output an alternating current obtained after compensation to the rectifier.

17. An electrical terminal, comprising:
an element that uses electricity;
a battery; and
a charging receiving apparatus, wherein the charging receiving apparatus is configured to charge the battery; and
wherein the battery is configured to supply power to the element that uses electricity, wherein the charging receiving apparatus comprises a receiver coil, a rectifier, and a controller;
wherein the receiver coil is configured to receive electromagnetic energy transmitted by a transmitter coil and output an alternating current;
wherein the rectifier comprises at least two controllable switches, and wherein the rectifier is configured to rectify the alternating current from the receiver coil to a direct current using the at least two controllable switches;
wherein the controller is configured to obtain a periodic signal having a same frequency as a current fundamental component by performing phase-locking on a phase of the current fundamental component of the alternating current received by the rectifier according to a phase difference between the current fundamental component and an initial preset periodic signal that are of a first round of the phase-locking; and
wherein the controller is further configured to:
generate a synchronization reference signal having the same frequency as the periodic signal;
generate drive signals of the controllable switches in the rectifier based on the synchronization reference signal; and
control, based on the drive signals, the at least two controllable switches in the rectifier to convert the alternating current into the direct current, wherein the drive signals and the current fundamental component have a same frequency.

18. A wireless charging control method, applied to a wireless charging receiving apparatus, the method comprising:

receiving electromagnetic energy transmitted by a transmitter coil;
outputting an alternating current in response to the receiving the electromagnetic energy;
obtaining a periodic signal having a same frequency as a current fundamental component by performing phase-locking on a current fundamental component of an alternating current rectifier according to a phase difference between the current fundamental component and an initial preset periodic signal that are of a first round of the phase-locking;
generating a synchronization reference signal having the same frequency as the periodic signal;
generating drive signals of controllable switches in a rectifier based on the synchronization reference signal; and
rectifying, based on the drive signals, the alternating current received by a receiver coil to a direct current, wherein the drive signals and the current fundamental component have a same frequency.

19. The control method according to claim 18, wherein the obtaining the periodic signal by performing the phase-locking on the current fundamental component comprises:
obtaining a phase difference between the current fundamental component of a first round of phase-locking and an initial preset periodic signal of the first round of phase-locking;
performing low-pass filtering on the phase difference to obtain a first period value after the filtering the synchronization reference signal having the same frequency as the periodic signal; and
obtaining the synchronization reference signal based on the first period value and a first preset comparison value, wherein the first preset comparison value is used to adjust a phase difference between the periodic signal and the synchronization reference signal.

20. The control method according to claim 19, wherein the generating the synchronization reference signal having the same frequency as the periodic signal comprises:
obtaining the synchronization reference signal based on the first period value and a first preset comparison value, wherein the first preset comparison value is used to adjust a phase difference between the periodic signal and the synchronization reference signal.

\* \* \* \* \*